(12) United States Patent
Horiuchi et al.

(10) Patent No.: US 6,774,467 B2
(45) Date of Patent: Aug. 10, 2004

(54) SEMICONDUCTOR DEVICE AND PROCESS OF PRODUCTION OF SAME

(75) Inventors: Michio Horiuchi, Nagano (JP); Takashi Kurihara, Nagano (JP); Tomio Nagaoka, Nagano (JP); Masao Aoki, Nagano (JP); Shigeru Mizuno, Nagano (JP)

(73) Assignee: Shinko Electric Industries Co., LTD, Nagano (JP)

( * ) Notice: Subject to any disclaimer, the term of this patent is extended or adjusted under 35 U.S.C. 154(b) by 0 days.

(21) Appl. No.: 09/812,276

(22) Filed: Mar. 20, 2001

(65) Prior Publication Data

US 2001/0026010 A1 Oct. 4, 2001

(30) Foreign Application Priority Data

Mar. 24, 2000 (JP) ........................................ 2000-088593
Aug. 23, 2000 (JP) ........................................ 2000-252846

(51) Int. Cl.[7] .......................................... H01L 23/495
(52) U.S. Cl. ........................................ 257/673; 257/787
(58) Field of Search ................................. 257/668, 673, 257/684, 787

(56) References Cited

U.S. PATENT DOCUMENTS

| | | | |
|---|---|---|---|
| 5,353,498 A | 10/1994 | Fillion et al. | |
| 5,497,033 A | 3/1996 | Fillion et al. | |
| 5,668,405 A | * 9/1997 | Yamashita | 257/668 |
| 5,892,271 A | * 4/1999 | Takeda et al. | 257/668 |
| 5,999,413 A | * 12/1999 | Ohuchi et al. | 361/772 |
| 6,023,096 A | * 2/2000 | Hotta et al. | 257/787 |
| 6,060,771 A | * 5/2000 | Tomikawa et al. | 257/787 |
| 2002/0149027 A1 | * 10/2002 | Takahashi et al. | 257/100 |

FOREIGN PATENT DOCUMENTS

JP          A-7-7134       1/1995

* cited by examiner

Primary Examiner—Eddie Lee
Assistant Examiner—Douglas W. Owens
(74) Attorney, Agent, or Firm—Paul & Paul

(57) ABSTRACT

Thin semiconductor device, especially a thin package, which reduces and achieves uniform mounting height, not requiring mounting of individual chips, improves manufacturing yield, without being affected by variation in chip thickness, enables testing alltogether, and process for producing same, the semiconductor mounted with back surface exposed upward, on top of an insulating substrate having throughholes in thickness direction, the area around semiconductor side surfaces being sealed by a resin layer, metal interconnections on the bottom surface of the substrate define bottom portions of throughholes of the substrate, a solder resist layer having throughholes in the thickness direction covers the bottom surface of metal interconnections and substrate, terminals extending downward from the active surface of the semiconductor are inserted into throughholes of the substrate, conductive filler fills gaps between the terminals and the throughholes of the substrate, and connection terminal and interconnections are electrically connected.

4 Claims, 34 Drawing Sheets

Fig. 3
(1)
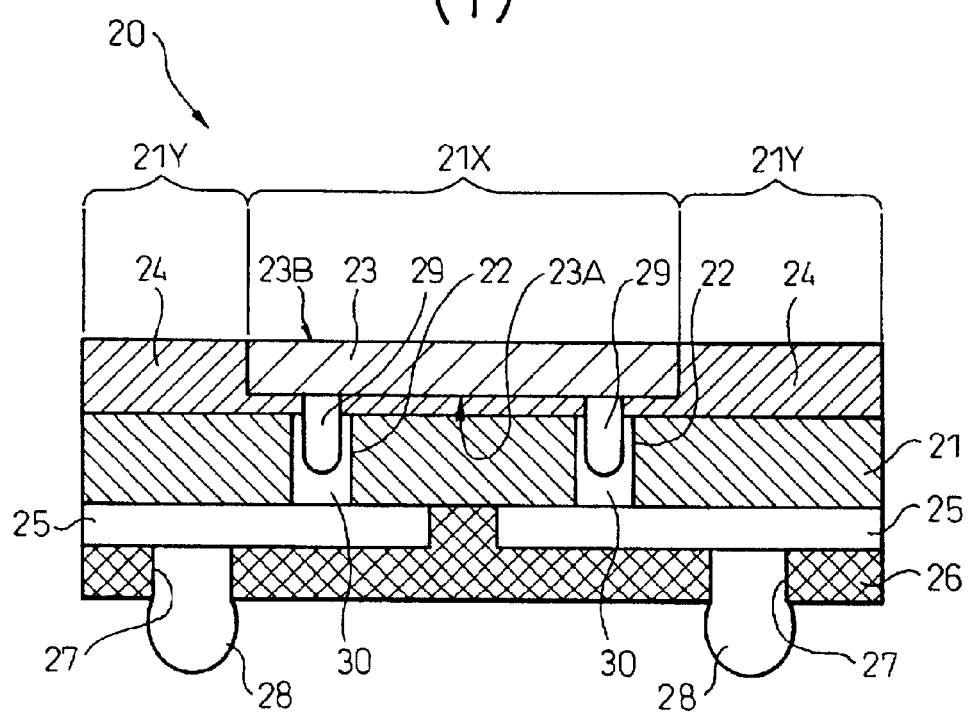
(2)
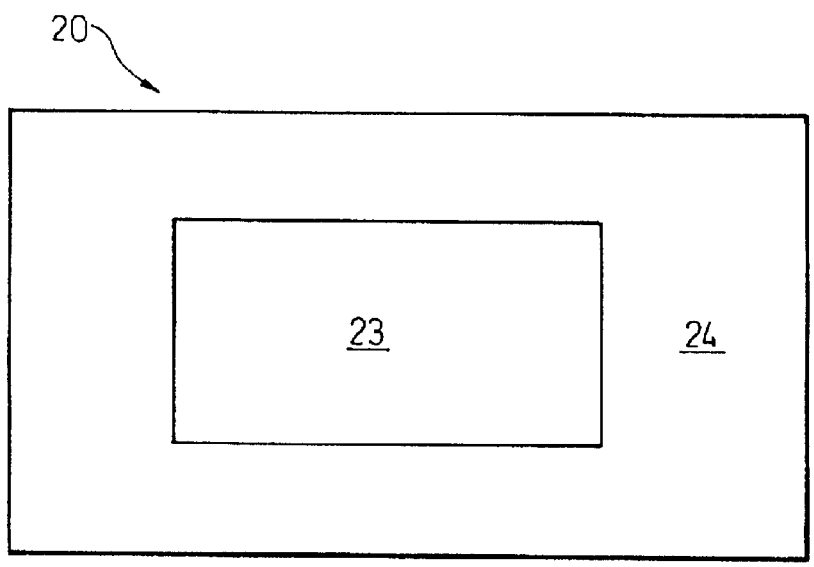

Fig.10
(1)
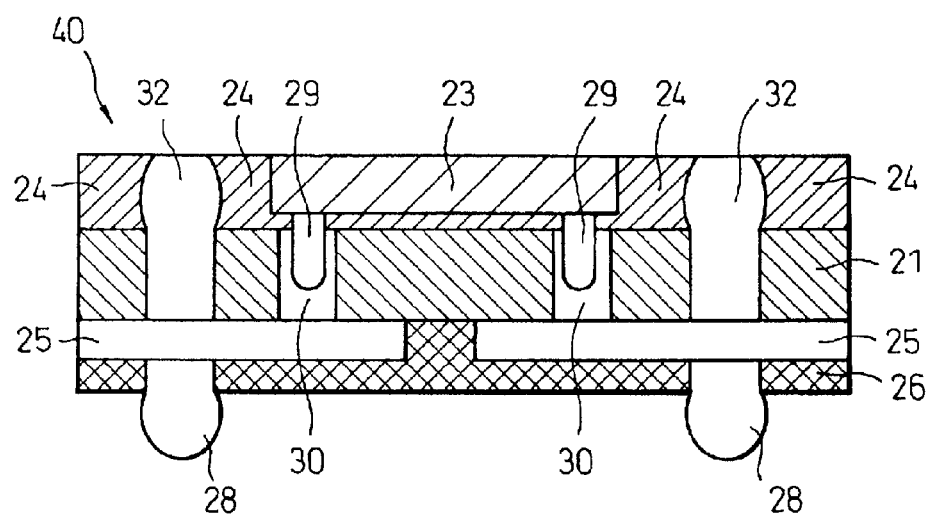
(2)
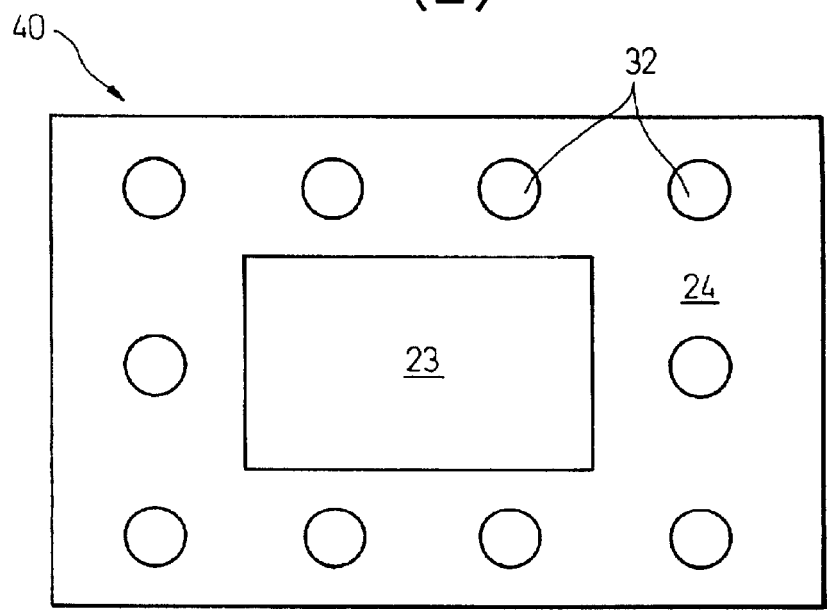

Fig.17
(1)
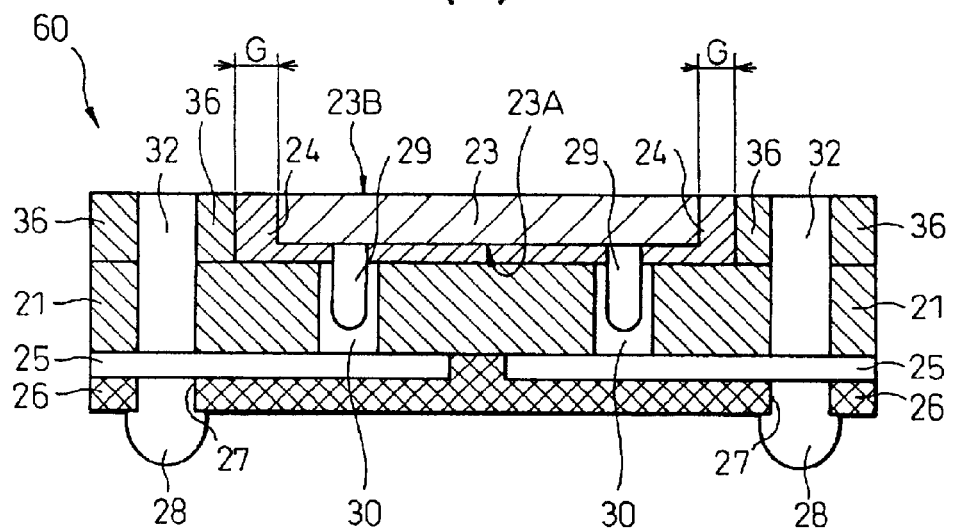
(2)
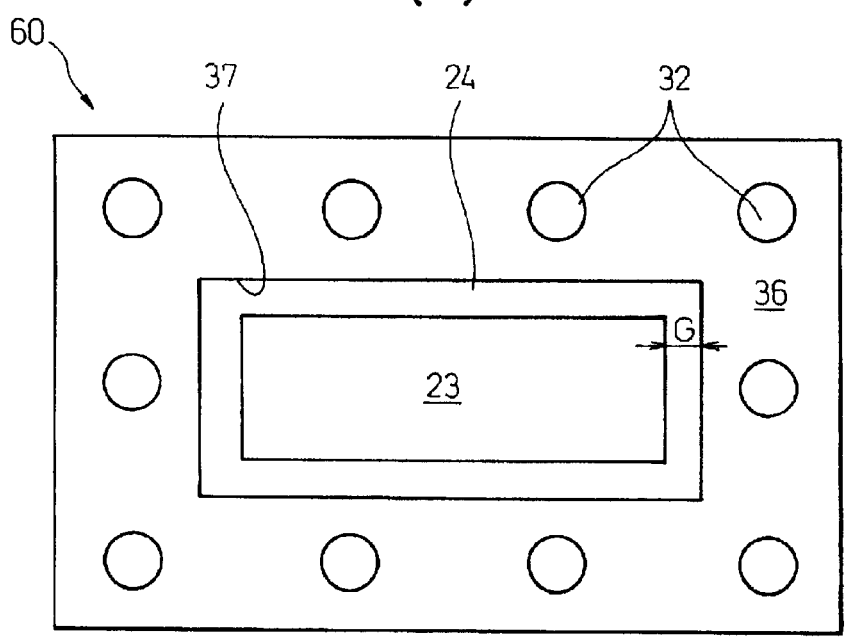

Fig.24
(1)
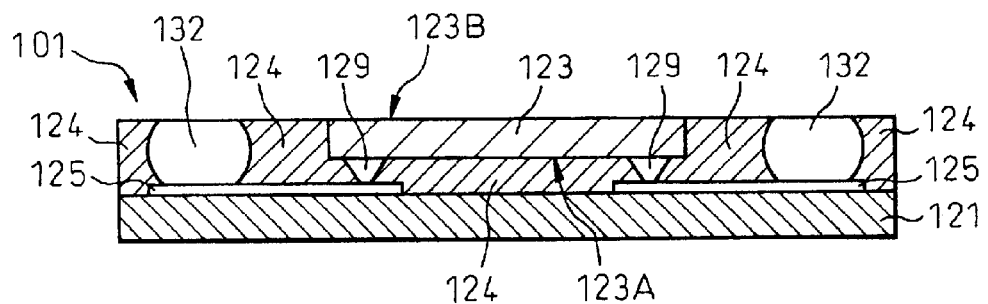
(2)
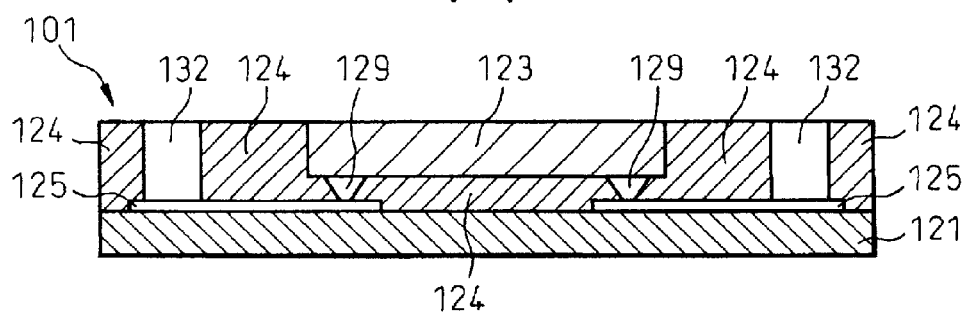
(3)
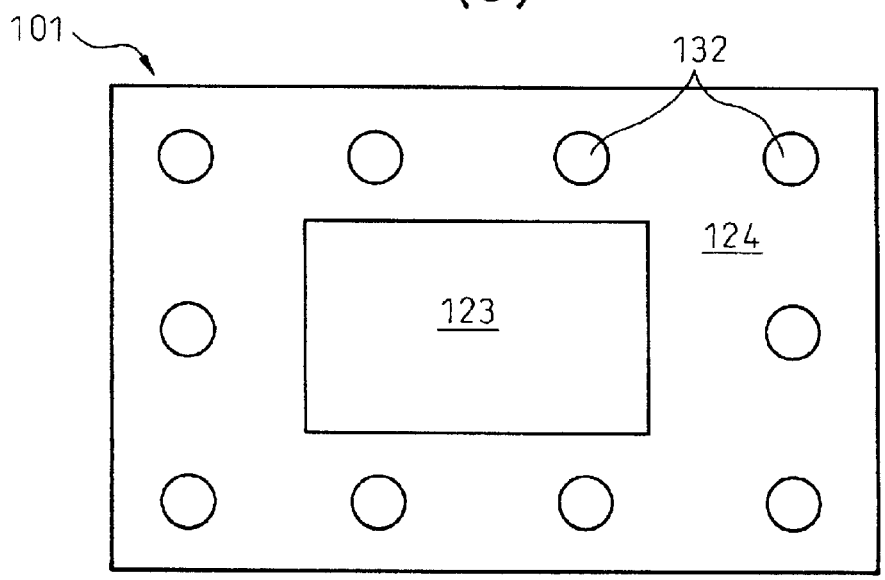

Fig.26
(1)
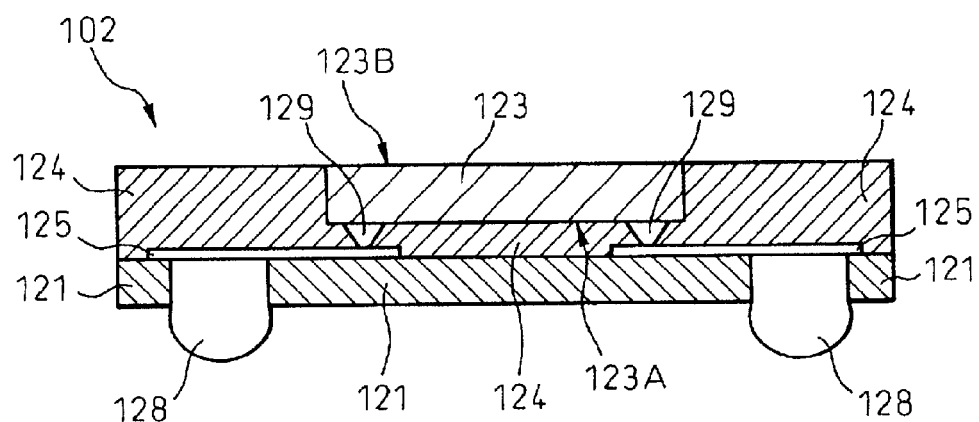
(2)
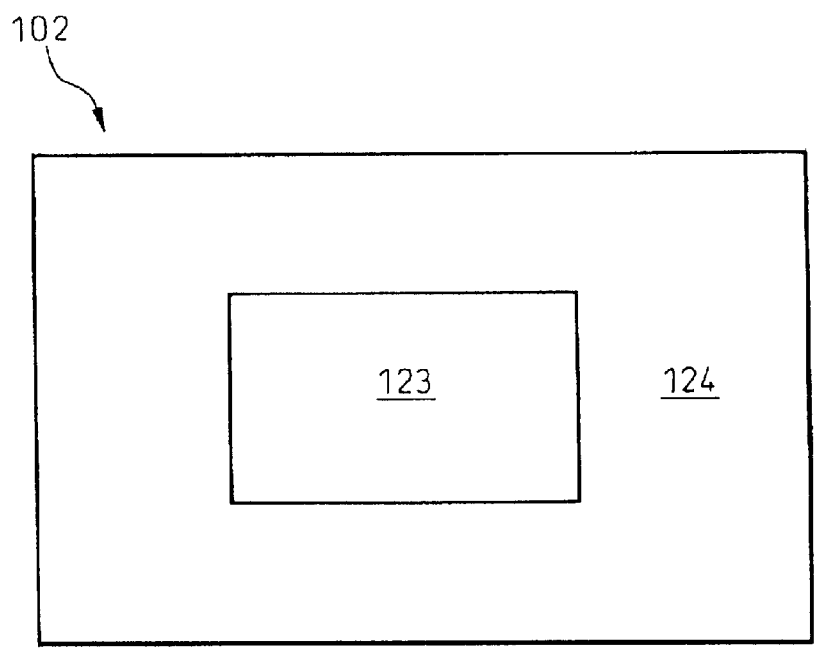

Fig.28
(1)
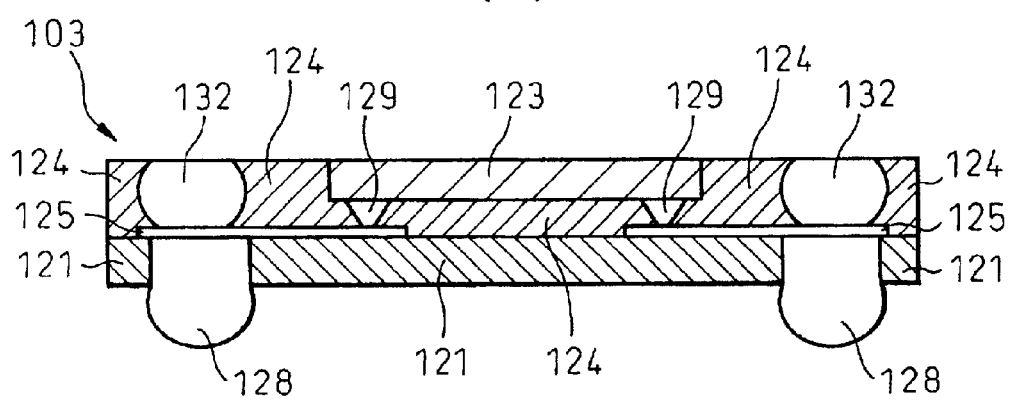
(2)
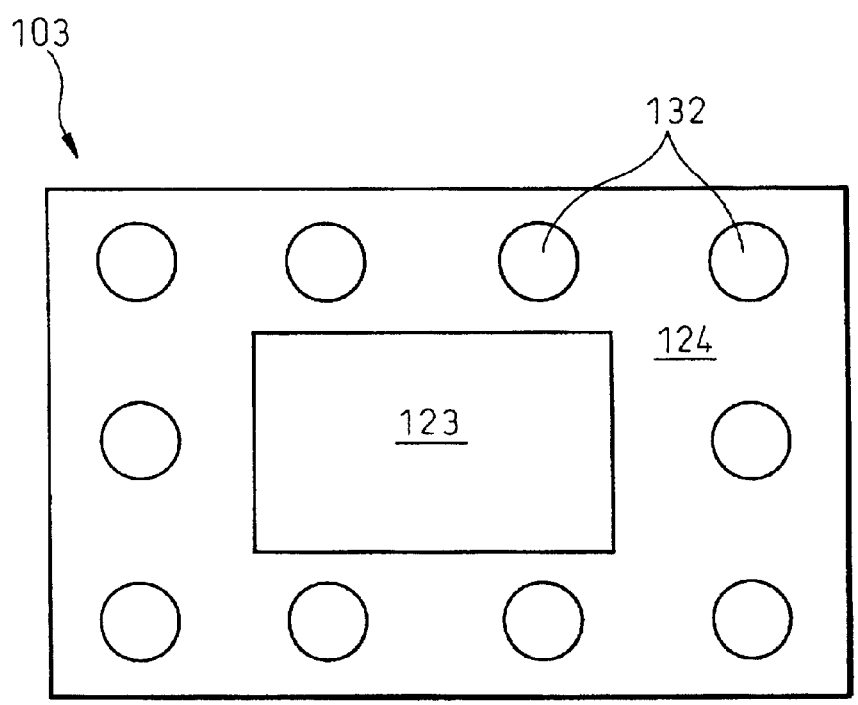

Fig.29
(1)
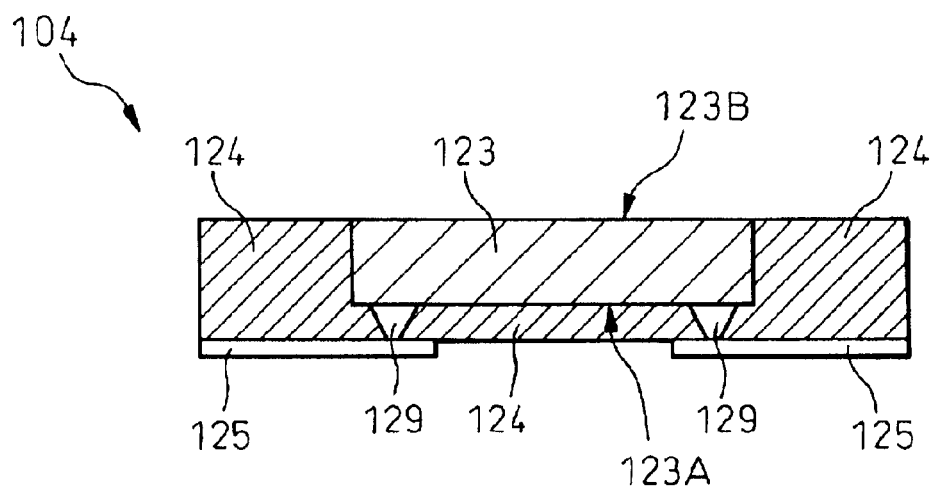
(2)
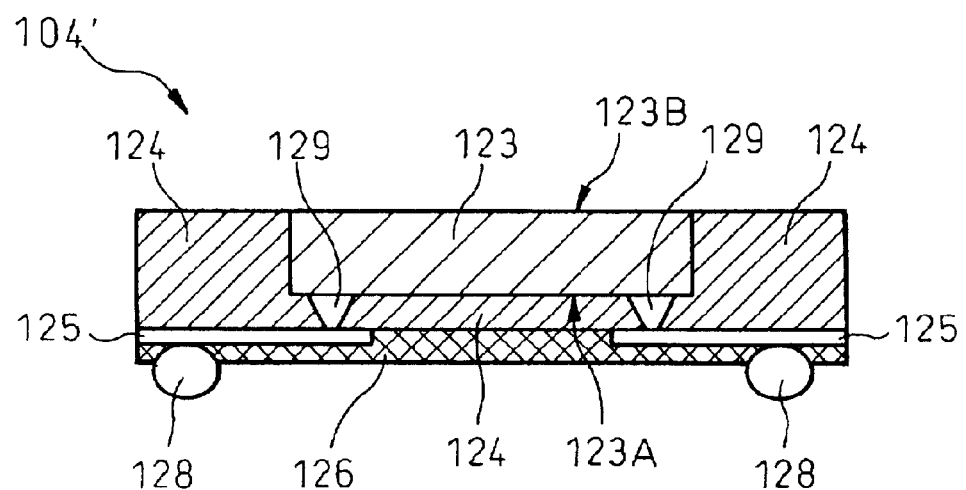

Fig.32
(1)
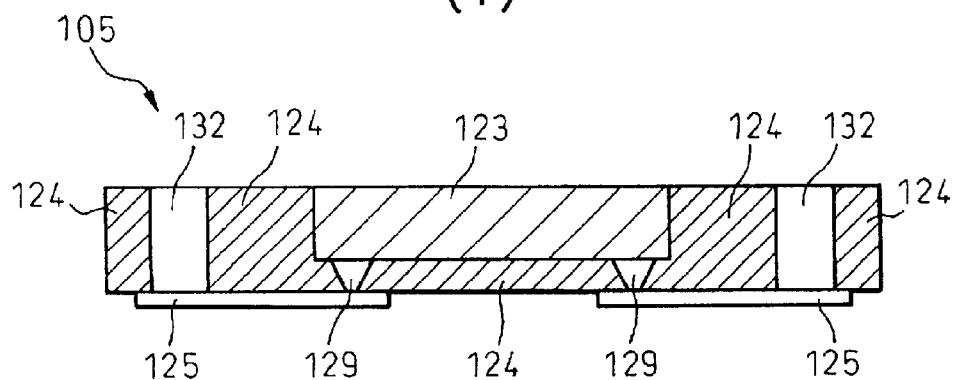
(2)
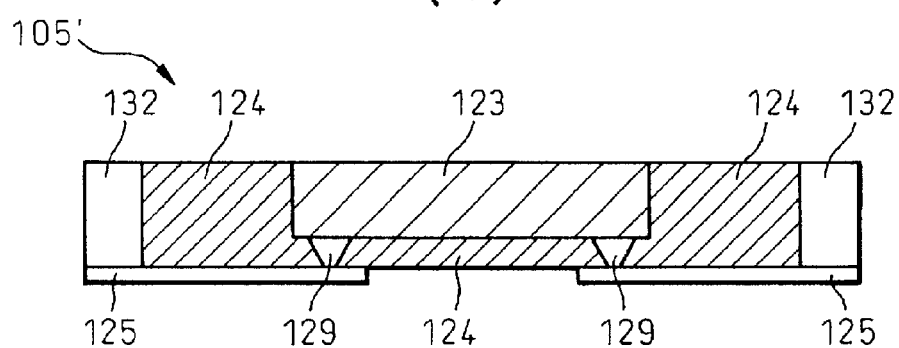
(3)
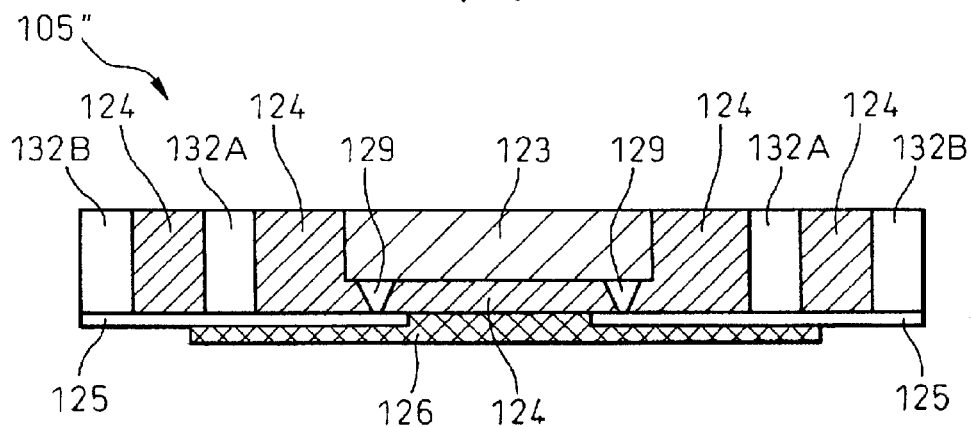

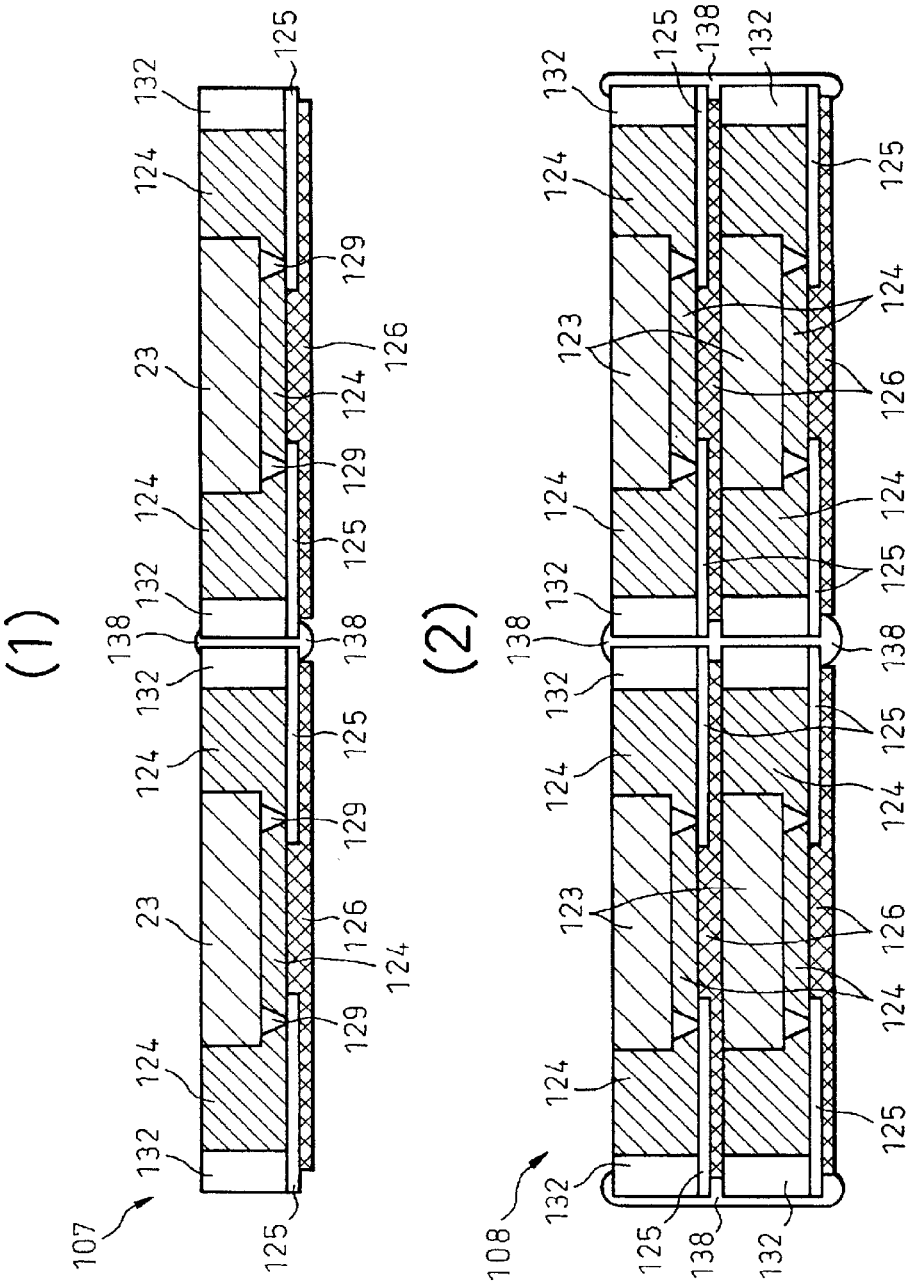

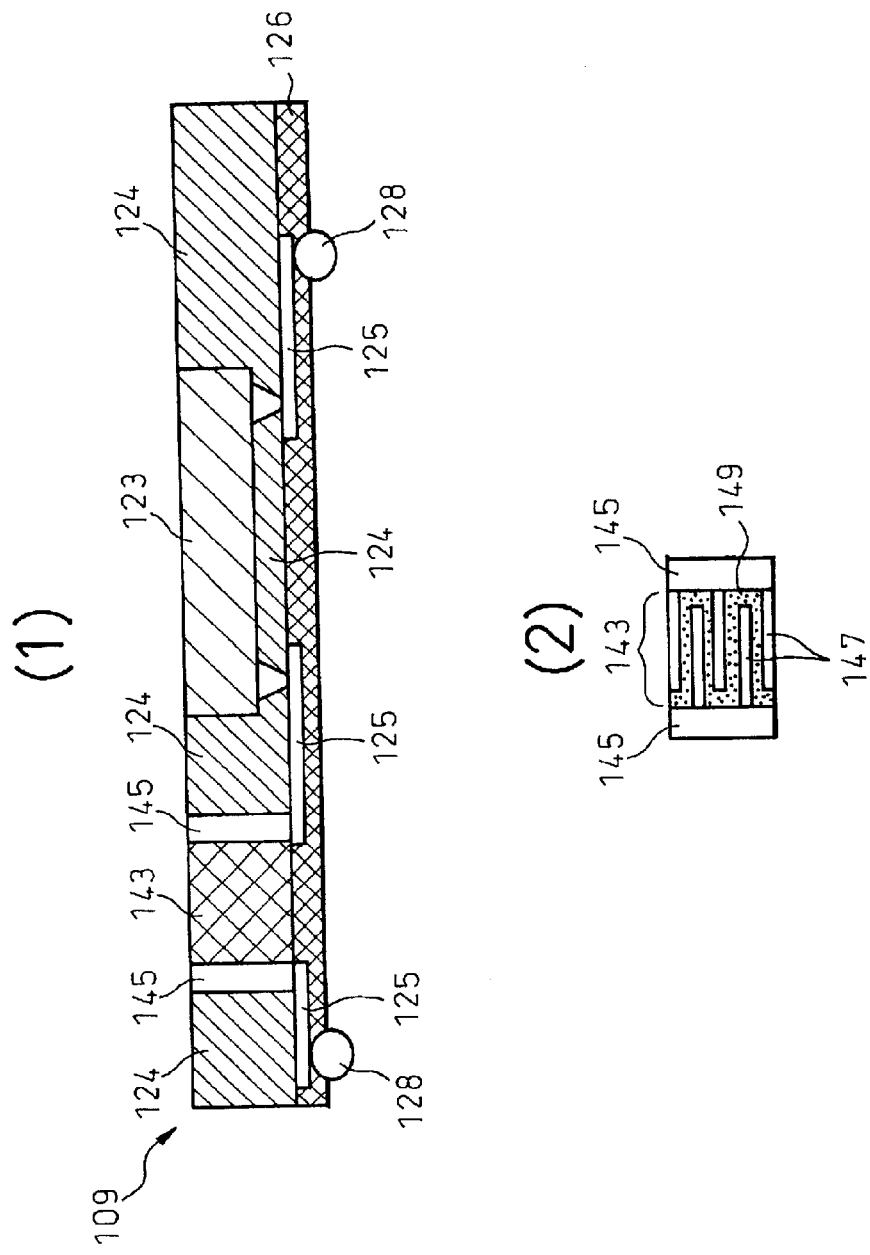

SEMICONDUCTOR DEVICE AND PROCESS OF PRODUCTION OF SAME

BACKGROUND OF THE INVENTION

1. Field of the Invention

The present invention relates to a semiconductor and a process for production of the same, more particularly relates to a thin package semiconductor device and a process of production of the same.

2. Description of the Related Art

The most flexible type of thin package semiconductor device mounting a semiconductor element (LSI or other semiconductor chip) for the increase of pins, reduction of the pitch between connection terminals, and reduction of thickness and size of the device as a whole is the tape carrier package (TCP).

A TCP is produced by mounting a semiconductor element on an insulating tape substrate (usually a resin film) by tape automated bonding (TAB). Typically, first, a copper foil is attached to a resin film provided with a predetermined pattern of openings, then the copper foil is etched to pattern it to form predetermined copper leads. Next, a semiconductor element (semiconductor chip) is positioned and held within an opening of the resin film, a plurality of connection terminals of the chip (in general gold bumps) and a corresponding plurality of copper leads on the resin film are bonded together, then the semiconductor chip and part of the copper leads are sealed by a resin to complete a single semiconductor package unit. This operation is repeated for every opening while intermittently feeding the resin film, whereby a large number of semiconductor package units are formed on a single film. Finally, the large number of semiconductor package units formed along the longitudinal direction of the film are cut and separated from each other so as to obtain individual semiconductor packages.

FIG. 1 is a perspective view of a semiconductor device of the related art obtained by connecting a semiconductor chip and TCP leads. It shows the state before the individual TCPs are cut from the tape. The TCP 10 uses a resin film (for example, a polyimide resin film) 1 as a substrate and has leads 2 formed by etching of a copper foil on top. Further, sprocket holes 3 are formed at the two side edges of the resin film 1 for feeding the film. An opening 5 for accommodating a semiconductor chip 4 (in general called a "device hole") and window holes 9 are also formed in the center of the resin film 1 as illustrated.

The state of connection of the semiconductor chip and the leads of the package is shown in the sectional view of FIG. 2, which shows the center portion of the semiconductor device of FIG. 1 enlarged. A semiconductor chip 4 is positioned and placed in the device hole 5 of the resin film 1, then the front ends of the leads 2 are bonded on the bumps on the electrodes (normally projections formed by gold plating). The leads are normally bonded all together using a special bonding tool. Note that to assist the bonding of the bumps 6 with the front ends of the leads 2 comprised of copper, the bumps are gold plated in advance before the bonding step. Finally, while not shown in FIG. 1, the semiconductor chip 4 and the leads 6 are protected from the humidity, contamination, etc. of the ambient environment by sealing the two to cover them by a resin 7. As the sealing resin 7, use is made for example of an epoxy resin.

The above conventional semiconductor device however suffered from the following problems (a) to (e):

(a) There are limits to the reduction of the mounting height of the semiconductor chip on a resin film, so there are limits to the reduction of thickness of the semiconductor device. That is, the semiconductor device is fixed by thin copper leads projecting out in a bridge like manner into the opening of the resin film, so securing sufficient mounting strength requires that the copper leads, the resin film serving as the support member, and the device as a whole be at least a certain thickness. If reinforcing the strength by the resin sealed portion, a broad area has to be sealed thickly. It is difficult however to secure complete sealing across a broad area. Further, thick sealing runs counter to the desire to reduce thickness.

(b) Semiconductor chips become brittle and easily warpable when made thin enough for reducing the thickness of the semiconductor device. Each requires a special carrier. Handling is extremely complicated and a large number of steps are required. Further, improvement of the manufacturing yield also becomes difficult.

(c) The individual semiconductor chips have to be individually positioned and bonded in the openings of the resin film, so production of a large number of semiconductor packages requires a long, complicated production process.

(d) In the case of a multilayer semiconductor device obtained by stacking semiconductor chips in a plurality of layers, each individual semiconductor chip has to be positioned and bonded in the opening of the resin film, so the production process becomes even longer and more complicated.

(e) Not only is there a manufacturing variation in the thickness of the chips, but there is also variation in the individual mounting heights. As a result, a variation in height arises in the semiconductor devices. It is consequently difficult to conduct electrical tests all together before cutting and separating the film into the semiconductor package units.

SUMMARY OF THE INVENTION

An object of the present invention is to solve the above problems in the related art and provide a semiconductor device, in particular a thin semiconductor package, which reduces and simultaneously achieves a uniform mounting height, does not require complicated steps for mounting individual chips, improves the manufacturing yield, achieves a uniform height of the semiconductor device without being affected by the variation in thickness of the chips, and enables execution of electrical tests all together and a process for production of the same.

To achieve the above object, according to a first aspect of the present invention, there is provided a semiconductor device provided with an insulating tape substrate having through holes in the thickness direction; a semiconductor element mounted on a top surface of the tape substrate with its back surface exposed upward and its active surface facing downward; a sealing resin layer formed on the top surface of the tape substrate outside of the region in which the semiconductor device is mounted and sealing the area around the side surfaces of the semiconductor element; metal interconnections formed on the bottom surface of the tape substrate and blocking the bottom ends of the through holes of the tape substrate to define bottom portions; a solder resist layer covering the metal interconnections and the bottom surface of the tape substrate and having through holes in the thickness direction; external connection terminals projecting from the bottom surface of the metal interconnections and filling, passing through, and projecting downward through the through holes of the solder resist layer; connection terminals extending downward from the active surface of the semiconductor element and inserted in the through holes of the tape substrate; and a filler comprised of a conductive material filling the gaps between the connection terminals and the inside walls of the through holes of the tape substrate and electrically connecting the connection terminals and the metal interconnections.

According to the present invention, there is also provided a process of production of a semiconductor device of the first aspect, comprising forming through holes in the thickness direction in a tape substrate having an area able to accommodate a plurality of semiconductor package units and provided at its bottom surface with a metal interconnection layer and a solder resist layer and forming throughholes in the thickness direction in the solder resist layer; filling a conductive material in the through holes of the tape substrate in amounts incompletely filling the through holes; inserting connection terminals of a number of semiconductor elements required for forming a plurality of semiconductor package units into the corresponding through holes of the tape substrate and filling the gaps between the connection terminals and the inside walls of the through holes by the conductive material until about the top ends of the through holes; bonding and mounting semiconductor elements on the top surface of the tape substrate; forming a sealing resin layer covering the top surface of the tape substrate other than the regions where the semiconductor elements are mounted and sealing the area around the side surfaces of the semiconductor element; grinding and polishing to a predetermined thickness the top part of the sealing resin layer and the back surface portions of the semiconductor elements; and cutting the tape substrate into semiconductor package units to obtain individual semiconductor devices. By providing connection terminals extending downward from the active surface of the semiconductor element and inserted into the through holes of the tape substrate and a filler comprised of a conductive material filling the gap between the connection terminals and the inner walls of the through holes of the tape substrate and electrically connecting the connection terminals and metal interconnections, it is possible to directly bond the semiconductor element to the tape substrate at the active surface and possible to electrically connect the semiconductor element to the metal interconnection layer by the connection terminals inserted in the through holes of the tape substrate and the filler comprised of the conductive material filling the gap, so the device can be made thinner than the past while easily securing mounting strength compared with a structure of affixing a semiconductor element in an opening of a tape substrate by leads like in the related art.

Further, since the back surfaces of the semiconductor elements and the sealing resin layer can be ground and polished from the top to reduce the height to a predetermined value in a state with a large number of semiconductor elements fixed to the tape substrate and with the area around the side surfaces of the semiconductor elements sealed by a resin, the individual semiconductor chips can be handled in a thick state without being made thin, no complicated steps or special carriers are required as in the past, a large number of semiconductor package units can be produced all together while integrally fixed to the tape substrate, the heights of the semiconductor devices, that is, the semiconductor packages, can be made small and uniform, the electrical tests can be performed all at once, the production process is shortened and the manufacturing yield improved, and the devices can be made thinner than in the past.

Preferably, the semiconductor device is further provided with conductor columns passing through the resin sealing layer and the tape substrate at a region where the resin sealing layer is formed, having top ends exposed at the top surface of the resin sealing layer, and having bottom ends electrically connected to the metal interconnection layer or is further provided with, instead of the sealing resin layer, an insulating frame bonded to the top surface of the tape substrate other than at the region where the semiconductor element is mounted and surrounding the side surfaces of the semiconductor element with a gap and a resin sealing layer filling the gap and sealing the area around the side surfaces of the semiconductor element and further provided with conductor columns passing through the frame and the tape substrate at a region where the frame is formed, having top ends exposed at the top surface of the frame, and having bottom ends electrically connected to the metal interconnection layer. These preferred structures are particularly advantageous when applied to a multilayer semiconductor device. A multilayer semiconductor device produced in this way is comprised of a plurality of such semiconductor devices stacked in layers, wherein the semiconductor devices of each layer are connected with each other at the top ends of the conductor columns and the bottom ends of the external connection terminals. Preferably, the connection terminals extending downward from the active surface of the semiconductor element are bumps comprised of gold or copper. Preferably, the external connection terminals filling and passing through the openings of the solder resist layer are arranged a peripheral or area array mode according to the application of the semiconductor device or the requirements of the customer. Preferably, the filler is filled in the gaps between the connection terminals and the through holes of the tape substrate up to positions of substantially the top ends of the through holes. That is, the amount of the filler is set so that the total volume with the connection terminals of the semiconductor element inserted later becomes substantially equal to the volume of the through holes of the tape substrate (with bottom portions defined by the metal interconnections). Due to this, the connection terminals and metal interconnections are reliably connected and, simultaneously, overflow of excess conductive material from the top ends of the through holes is prevented. As the conductive material, use may be made of a low melting point metal or a conductive paste. Preferably, since the heights of the large number of semiconductor package units formed on the tape substrate are made uniform, it is possible to easily perform electrical tests all together after forming the sealing resin layer and before or after the grinding and the polishing.

Preferably, the tape substrate is of a size able to accommodate the plurality of semiconductor package units and is shaped as a disk of 2 to 12 inches in diameter. Due to this, it is possible to use existing grinding machines or cutting machines or other facilities for processing semiconductor wafers of the same size, so the cost of new equipment can be reduced by that amount.

According to a second aspect of the present invention, there is provided a semiconductor device provided with an insulating tape substrate having metal interconnections on the top surface; a semiconductor element mounted on a top surface of the tape substrate with its back surface exposed upward and its active surface facing downward; a sealing resin layer formed on the top surface of the tape substrate, sealing the area around the side surfaces of the semiconductor element, and filling the gap between the active surface of the semiconductor element and the top surface of the tape substrate; and at least one of conductor columns extending upward from the top surfaces of the metal interconnections, passing through the sealing resin layer at the area around the side surfaces of the semiconductor element, and having top ends exposed upward and of external connection terminals extending downward from the bottom surfaces of the metal interconnections, passing through the tape substrate, and projecting downward.

Typically, the top surface of the sealing resin layer and the back surface of the semiconductor element form substantially the same plane.

The semiconductor device of the second aspect of the present invention may be produced by one of the following three processes of production depending on whether it is provided with the conductor columns, the external connection terminals, or both.

First, there is provided a process of production of a semiconductor device comprising preparing a tape substrate having an area able to accommodate a plurality of semiconductor package units and provided at its top surface with metal interconnections; bonding connection terminals of active surfaces of a number of semiconductor elements required for forming the plurality of semiconductor package units to the top surfaces of the metal interconnections of the tape substrate to mount the semiconductor elements on the top surface of the tape substrate; forming conductor columns with bottom ends bonded to the top surfaces of the metal interconnections; forming a sealing resin layer sealing the area around the side surfaces of the semiconductor elements, including the metal interconnections and conductor columns, and filling the gaps between the active surfaces of the semiconductor elements and the top surface of the tape substrate; grinding and polishing to a predetermined thickness the top part of the sealing resin layer and the back surface portions of the semiconductor elements and exposing the top ends of the conductor columns upward; and cutting the tape substrate into semiconductor package units to obtain individual semiconductor devices.

Second, there is provided a process of production of a semiconductor device comprising preparing a tape substrate having an area able to accommodate a plurality of semiconductor package units, provided at its top surface with metal interconnections, having through holes in a thickness direction at positions corresponding to external connection terminals, and having bottom surfaces of the metal interconnections defining top ends of the through holes; bonding connection terminals of active surfaces of a number of semiconductor elements required for forming the plurality of semiconductor package units to the top surfaces of the metal interconnections of the tape substrate to mount the semiconductor elements on the top surface of the tape substrate; forming a sealing resin layer sealing the area around the side surfaces of the semiconductor elements, including the metal interconnections, and filling the gaps between the active surfaces of the semiconductor elements and the top surface of the tape substrate; then, in either order, grinding and polishing to a predetermined thickness the top part of the sealing resin layer and the back surface portions of the semiconductor elements and forming external connection terminals extending downward from the bottom surfaces of the metal interconnections defining the top ends of the through holes, filling the through holes, and projecting downward; and cutting the tape substrate into semiconductor package units to obtain individual semiconductor devices.

Third, there is provided a process of production of a semiconductor device comprising preparing a tape substrate having an area able to accommodate a plurality of semiconductor package units, provided at its top surface with metal interconnections, having through holes in a thickness direction at positions corresponding to external connection terminals, and having bottom surfaces of the metal interconnections defining top ends of the through holes; bonding connection terminals of active surfaces of a number of semiconductor elements required for forming the plurality of semiconductor package units to the top surfaces of the metal interconnections of the tape substrate to mount the semiconductor elements on the top surface of the tape substrate; forming conductor columns with bottom ends bonded to the top surfaces of the metal interconnections; forming a sealing resin layer sealing the area around the side surfaces of the semiconductor elements, including the metal interconnections and conductor columns, and filling the gaps between the active surfaces of the semiconductor elements and the top surface of the tape substrate; then, in either order, grinding and polishing to a predetermined thickness the top part of the sealing resin layer and the back surface portions of the semiconductor elements and exposing the top ends of the conductor columns upward and forming external connection terminals extending downward from the bottom surfaces of the metal interconnections defining the top ends of the through holes, filling the through holes, and projecting downward; and cutting the tape substrate into semiconductor package units to obtain individual semiconductor devices.

By having the bottom ends of the connection terminals projecting downward from the active surface of the semiconductor element be connected to the top surfaces of the metal interconnections on the top surface of the tape substrate, it is possible to further simplify the structure than when connecting the connection terminals and the metal interconnections through a filler in the through holes of the tape substrate as in the first aspect of the invention and therefore it is possible to further improve the productivity of thin semiconductor devices.

Further, in the same way as the first aspect of the invention, since the back surfaces of the semiconductor elements and the sealing resin layer can be ground and polished from the top to reduce the height to a predetermined value in a state with a large number of semiconductor elements fixed to the tape substrate and with the area around the side surfaces of the semiconductor elements sealed by a resin, the individual semiconductor chips can be handled in a thick state without being made thin, no complicated steps or special carriers are required as in the past, a large number of semiconductor package units can be produced all together while integrally fixed to the tape substrate, the heights of the semiconductor devices, that is, the semiconductor packages, can be made small and uniform, the electrical tests can be performed all at once, the production process is shortened and the manufacturing yield improved, and the devices can be made thinner than in the past.

According to a third aspect of the present invention, there is provided a semiconductor device provided with a resin member of a predetermined thickness; a semiconductor element sealed inside the resin member, having a back surface exposed at a top surface of the resin member, and having an active surface facing downward; metal interconnections formed on the bottom surface of the resin member; and connection terminals extending downward from the active surface of the semiconductor element and having a bottom end connected to top surfaces of the metal interconnections.

Typically, the top surface of the sealing resin layer and the back surface of the semiconductor element form substantially the same plane.

According to the present invention, there is also provided a process of production of a semiconductor device of the third aspect, comprising mounting on the top surface of a metal substrate having an area able to accommodate a plurality of semiconductor package units semiconductor elements by turning the active surfaces of semiconductor elements downward and bonding front ends of connection terminals to the metal substrate; covering the entire top surface of the metal substrate by a resin to form a resin member in which the semiconductor elements are sealed and to the bottom surface of which the metal substrate is bonded; then, in either order, grinding and polishing to a predetermined thickness the top part of the sealing resin layer and the back surface portions of the semiconductor elements and patterning the metal substrate to form metal interconnections with top surfaces connected to the bottom ends of the connection terminals on the bottom surface of the resin member; and cutting the resin member into semiconductor package units to obtain individual semiconductor devices.

According to the present invention, there is also provided another process of production of a semiconductor device of the third aspect, comprising preparing a composite metal plate comprised of a metal substrate having an area able to accommodate a plurality of semiconductor package units and of an interconnection pattern comprised of a different type of metal from the metal substrate on its top surface; mounting semiconductor elements on the top surface of the composite metal plate by turning the active surfaces of semiconductor elements downward and bonding front ends of connection terminals to the composite metal plate; covering the entire top surface of the composite metal plate by a resin to form a resin member in which the semiconductor elements are sealed and to the bottom surface of which the composite metal plate is bonded; then, in either order, grinding and polishing to a predetermined thickness the top part of the resin member and the back surface portions of the semiconductor elements and etching away the metal substrate of the composite metal plate and leaving the interconnection pattern so as to form metal interconnections comprised of the interconnection pattern with top surfaces connected to the bottom ends of the connection terminals on the bottom surface of the resin member; and cutting the resin member into semiconductor package units to obtain individual semiconductor devices.

By not including a tape substrate, it is possible to further reduce the thickness compared with the first and third aspects of the present invention. At the same time, the number of members is reduced and structure is simpler, so a further higher productivity can be achieved.

Further, in the same way, since a large number of semiconductor elements are sealed in a single resin member and the back surfaces of the semiconductor elements and the resin member can be ground and polished from the top to reduce the height to a predetermined value, the individual semiconductor chips can be handled in a thick state without being made thin, no complicated steps or special carriers are required as in the past, a large number of semiconductor package units can be produced all together while integrally fixed in the resin member, the heights of the semiconductor devices, that is, the semiconductor packages, can be made small and uniform, the electrical tests can be performed all at once, the production process is shortened and the manufacturing yield improved, and the devices can be made thinner than in the past.

Preferably, the semiconductor device is further provided with a plurality of conductor columns passing through the resin member from the top surfaces of the metal interconnections, extending upward, and having top ends exposed at the top surface of the resin member. Due to this, it is also possible to easily obtain a multilayer semiconductor device comprised of a plurality of semiconductor devices stacked in layers, wherein the semiconductor devices of each layer are connected with each other at the top ends of the conductor columns and the bottom ends of the metal interconnections through connection bumps.

More preferably, the side surfaces of the conductor columns are exposed at the side surfaces of the resin member. Due to this, it is also possible to easily obtain a parallel semiconductor device comprised of a plurality of semiconductor devices connected to each other at their side surfaces, wherein the semiconductor devices adjoining each other at their sides are electrically connected with each other at the side surfaces of the conductor columns exposed at the side surfaces of the resin member. Further, it is also possible to easily obtain a multilayer parallel semiconductor device comprised of a plurality of semiconductor devices stacked in layers and connected to each other at their side surfaces, wherein the semiconductor devices of each layer are electrically connected with each other at the top ends of the conductor columns and the bottom ends of the metal interconnections through connection bumps and wherein the semiconductor devices adjoining each other at their sides are electrically connected with each other at the side surfaces of the conductor columns exposed at the side surfaces of the resin member.

Preferably, the semiconductor device is further provided with a solder resist layer covering the entire bottom surface of the resin member including the metal interconnections and connection bumps formed on the bottom surfaces of the metal interconnections, passing through the solder resist layer, and projecting downward.

Preferably, the semiconductor device is further provided with a capacitor sealed inside the resin member and directly connected with the metal interconnections. More preferably, the capacitor is a multilayer ceramic capacitor including inner electrodes each having the surface being perpendicular to the thickness direction of the resin member. Still more preferably, an inorganic filler is dispersed in the resin member. Due to this, it is possible to adjust the thermal expansion coefficient and the heat conductivity of the resin member to desired values.

According to the above aspects of the invention, further, it is possible to inspect individual semiconductor devices, select only the good ones, and produce a multilayer, parallel, and multilayer parallel type semiconductor devices with elements connected across layers and/or at their sides. Therefore, it is possible to further improve the product yield.

BRIEF DESCRIPTION OF THE DRAWINGS

The above object and features of the present invention will be more apparent from the following description of the preferred embodiments given with reference to the accompanying drawings, wherein:

FIG. 3 shows an example of a semiconductor device according to the first aspect of the present invention, in (1) sectional and (2) top views;

FIG. 10 shows another example of a semiconductor device according to the first aspect of the present invention, in (1) sectional and (2) top views;

FIG. 17 shows still another example of a semiconductor device according to the first aspect of the present invention, in (1) sectional and (2) top views;

FIG. 24 shows an example of a semiconductor device according to the second aspect of the present invention, in (1) sectional, (2) sectional and (3) top views;

FIG. 26 shows another example of a semiconductor device according to the second aspect of the present invention, in (1) sectional and (2) top views;

FIG. 28 shows still another example of a semiconductor device according to the second aspect of the present invention, in (1) sectional and (2) top views;

FIG. 29 shows an example of a semiconductor device according to the third aspect of the present invention, in sectional views;

FIG. 32 shows another example of a semiconductor device according to the third aspect of the present invention, in sectional views;

FIG. 34 shows, in sectional views, a parallel semiconductor device comprised of the semiconductor devices of FIG. 32 connected in parallel and a multilayer parallel semiconductor device comprised of those devices stacked in layers and connected in parallel; and FIG. 35 shows an example of a semiconductor device of the third aspect of the present invention including a capacitor, in (1) sectional and (2) partially enlarged sectional views.

DESCRIPTION OF THE PREFERRED EMBODIMENTS

Figure 1:
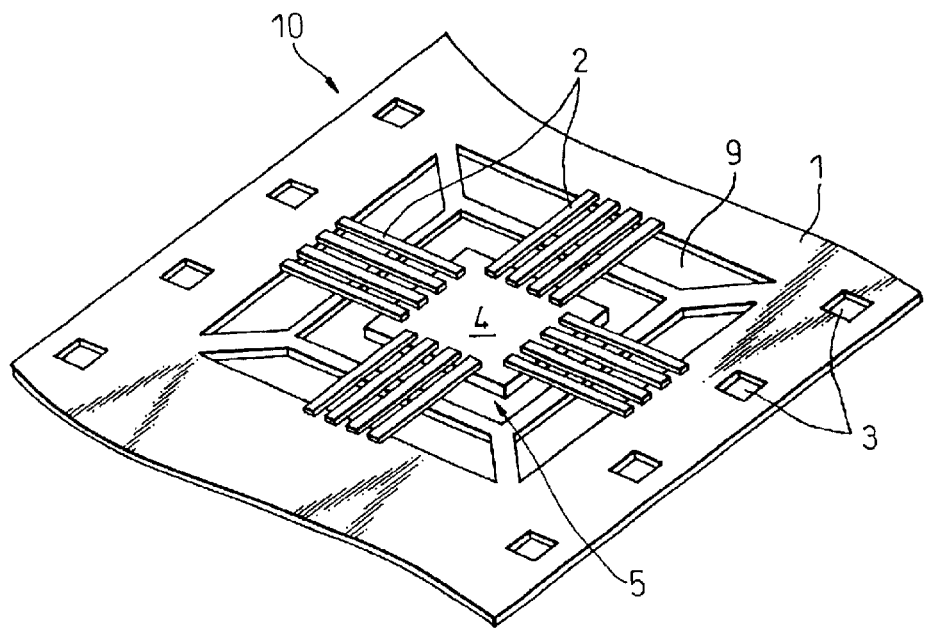
FIG. 1 is a perspective view of a semiconductor device of the related art after connecting a semiconductor chip and leads of a TCP and shows the state before cutting the individual TCPs from a tape.
Figure 2:
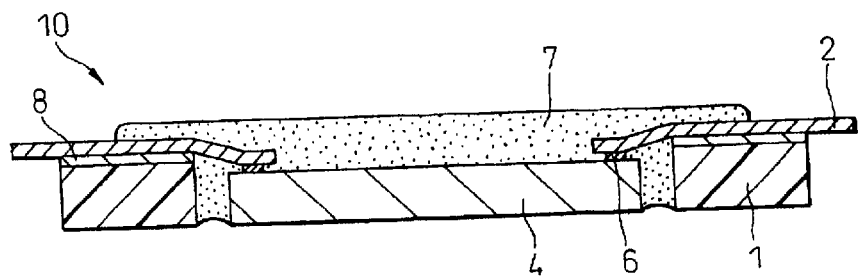
FIG. 2 is a sectional view of the connection of a semiconductor chip and leads of a package in the related art and shows the center part of the semiconductor device of FIG. 1 enlarged.

Preferred embodiments of the present invention will be explained in further detail below with reference to the attached drawings.

First Embodiment

FIG. 3 shows, (1) sectional and (2) top views, an example of a semiconductor device according to the first aspect of the present invention.

The illustrated semiconductor device 20 is comprised of an insulating tape substrate 21 having through holes 22 in the thickness direction and a semiconductor element 23 bonded to its top surface with a back surface 23B exposed upward and with an active surface 23A facing downward. A sealing resin layer 24 is formed on a region 21Y of the top surface of the tape substrate other than the region 21X where the semiconductor element 23 is bonded and seals the area around the side surfaces of the semiconductor element 23. The metal interconnections 25 formed on the bottom surface of the tape substrate 21 block the bottom ends of the through holes 22 of the tape substrate 21 and define bottom portions. A solder resist layer 26 having through holes 27 in the thickness direction covers the bottom surfaces of the metal interconnections 25 and the tape substrate 21. External connection terminals 28 projecting from the bottom surface of the metal interconnections 25 fill and pass through the through holes 27 of the solder resist layer 23A and project downward. Connection terminals 29 extending downward from the active surface 23A of the semiconductor element 23 are inserted into the through holes of the tape substrate 21. The connection terminals 29 and the metal interconnections 25 are electrically connected by the filler 30 of the low melting point metal filled in the gaps between the connection terminals 29 and the inside walls of the through holes 22 of the tape substrate 21.

As the filler 30, a conductive paste may be used instead of the low melting point metal. As the conductive paste, generally use is made of a silver paste or copper paste comprised of a polyimide resin or epoxy resin in which silver or copper particles are dispersed. These conductive pastes are filled in the through holes by screen printing etc.

In the illustrated example, the back surface of the semiconductor element 23 and the top surface of the sealing resin layer 24 are on the same plane, but so long as the sealing resin layer 24 seals the area around the side surfaces of the semiconductor element 23, they do not necessarily have to be in the same plane. The height of the sealing resin layer 24 may also be made lower than the back surface of the semiconductor element 23 at a location away from the side surfaces of the semiconductor element 23.

An example of the process of production of the semiconductor device of the first aspect of the present invention shown in FIG. 3 will be explained with reference to FIG. 4 to FIG. 9.

Figure 4:
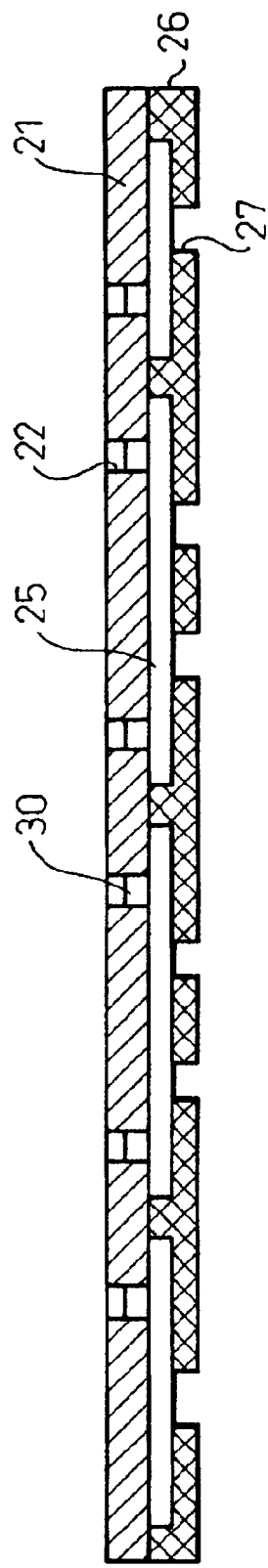
FIG. 4 is a sectional view of an initial structure first prepared for producing the semiconductor device according to the first aspect of the present invention shown in FIG. 3.

FIG. 4 shows the initial structure which is initially prepared. The tape substrate 21 has an area able to accommodate a plurality of semiconductor package units and is provided at its bottom surface with a metal interconnection layer 25 and solder resist layer 26. As the tape substrate 21, various organic materials or polymer materials may be used. In general, however, a polyimide film, a glass or aramide or other fiber reinforced epoxy film or bismaleimide triazine (BT) film, polyphenylene ether (PPE) film, or other resin film or resin sheet is suitable. The thickness of the tape substrate 21 is preferably as thin as possible for reducing the thickness of the semiconductor device to the extent where the strength and rigidity necessary for the substrate are secured. In general, it is in the range of 25 $\mu$m to 100 $\mu$m, in particular around 75 $\mu$m.

Through holes 22 are formed in the tape substrate 21 by punching etc., then a copper foil is adhered on one surface to form a metal interconnection layer 25. Alternatively, a copper foil clad tape combining a tape substrate 21 and copper foil is used and the tape substrate 21 portion laser processed to form holes passing through the tape substrate 21 and having the copper foil as bottom portions. The copper foil clad tape is obtained by forming an insulating layer on a copper foil by coating polyimide or another resin.

Next, a filler 30 of a low melting point metal is incompletely filled in the through holes 22 of the tape substrate 21 (with bottom portions defined by the metal interconnection layer 25). That is, the amount of filler is made so that the filler 30 fills the gaps between the connection terminals 29 and the inside walls of the through holes 22 up to substantially the top ends of the through holes 22 when the connection terminals 29 of the semiconductor elements 21 are inserted in a later step. As the low melting point metal of the filler 30, use may be made of a silver-tin alloy (Ag—Sn), a lead-tin alloy (Pb—Sn), a silver-tin-copper alloy (Ag—Sn—Cu), and alloys of these with bismuth (Bi) or antimony (Sb). The filler is preferably filled by electrolytic plating using the copper foil as the layer supplying the power, but it may also be filled by screen printing a solder paste.

Next, the above copper foil is patterned by etching to form the metal interconnection layer 25. After the metal interconnection layer 25 is formed, a solder resist layer 26 having through holes 27 is formed. The solder resist layer 26 having through holes 27 is formed by generally formed by coating, exposing, and developing a photosensitive resist. When the number of external connection terminals (number of through holes 27) is small and the pitch between external connection terminals is sufficiently large, the layer may also be formed by screen printing a resin. The through holes 27 of the solder resist layer 26 are formed in a peripheral or area array in accordance with the application of the semiconductor devices 20 to be produced.

Figure 5:
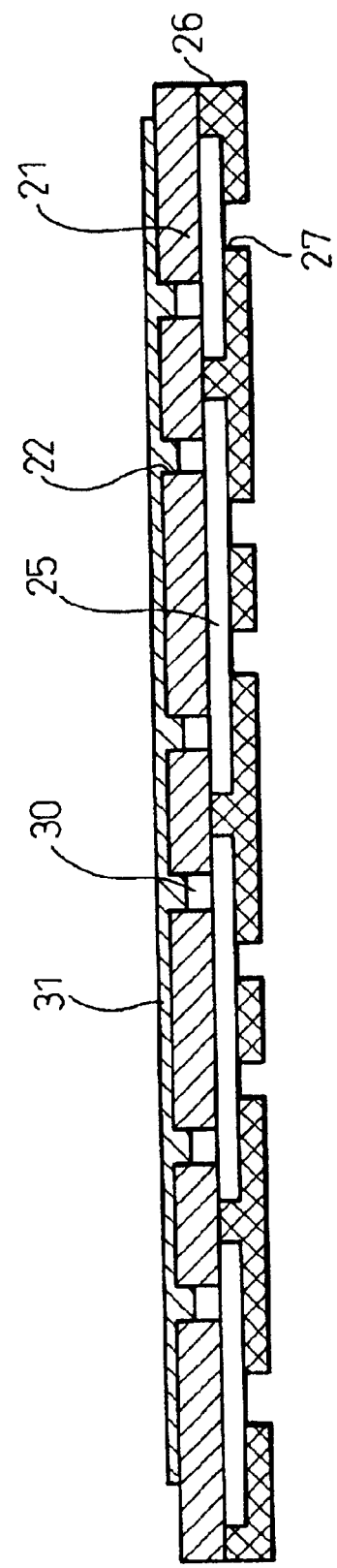
FIG. 5 is a sectional view of the state when forming an insulating coating on the initial structure shown in FIG. 4.

Next, as shown in FIG. 5, an insulating coating 31 comprised of a liquid or a semicured resin is coated on the top surface of the tape substrate 21. The semicured insulating coating 31 acts to bond the semiconductor elements.

Figure 6:
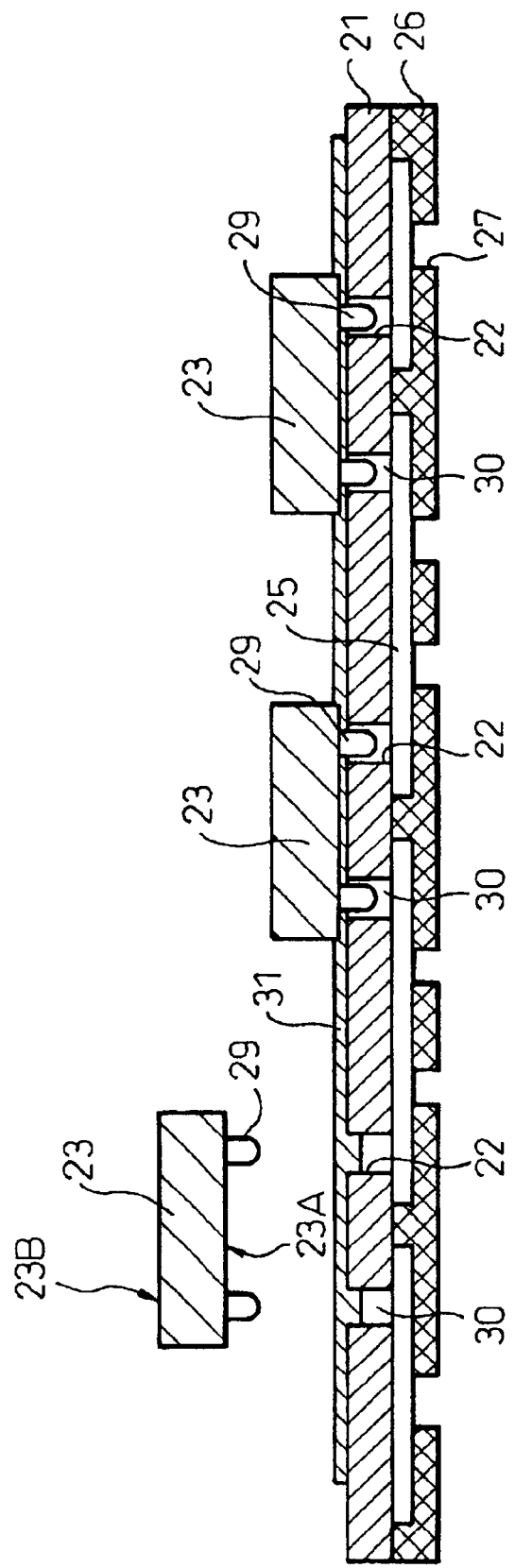
FIG. 6 is a sectional view of the step of arranging and bonding semiconductor elements on the coating before curing.

Next, as shown in FIG. 6, the semiconductor elements 23 are arranged on and bonded to the precured coating 31. That is, the connection terminals 29 of the number of semiconductor elements 23 necessary for forming the plurality of semiconductor package units are inserted into the corresponding through holes 22 of the tape substrate 21, the gaps between the connection terminals 29 and the inside walls of the through holes 22 are filled with the low melting point metal 30 up to substantially the top ends of the through holes 22, and the semiconductor elements 23 are bonded to and mounted on the top surface of the tape substrate 21. This is done by heating the semiconductor elements 23 to a temperature near the melting point of the low melting point metal 30 and pushing the connection terminals 29 into the low melting point metal 30 in the through holes 22.

The connection terminals 29 of the semiconductor elements 23 are desirably formed as gold or copper bumps. In the case of a semiconductor element 23 with connection terminals 29 arranged at the peripheral edge regions, generally the connection terminals 29 are formed as stud bumps using the wire bonding method. In the case of a semiconductor element 23 with connection terminals 29 arranged in the active region at the center, the connection terminals 29 are desirably formed by plating from the viewpoint of avoiding mechanical shock resulting from the formation of stud bumps. The plating method is particularly advantageous when forming bumps in an area array along with the interconnection portion on the semiconductor elements. Stud bumps are desirably formed by gold. Plated bumps are desirably formed as copper posts provided with protective plating layers.

The size of the connection terminals, that is, the bumps 29, may be freely set in accordance with the design thickness of the semiconductor devices 20. In one example, the bumps 29 have a diameter of the bottom portions of 70 $\mu$m and a height of 30 to 60 $\mu$m. In this case, when considering the positioning accuracy in the formation of bumps 29, the through holes 22 of the tape substrate 21 in which the bumps 29 are inserted suitably have diameters in the range of 90 to 150 $\mu$m.

Figure 7:
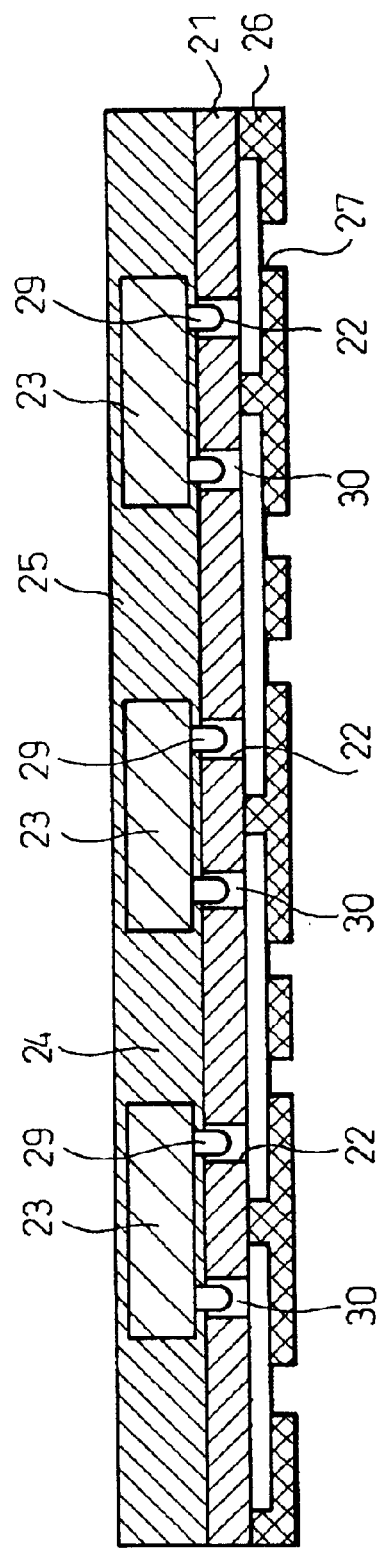
FIG. 7 is a sectional view of the state when forming a sealing resin layer covering the top surface of the tape substrate at other than the regions where the semiconductor elements are formed and sealing at least the areas surrounding the side surfaces of the semiconductor elements.

Next, as shown in FIG. 7, a sealing resin layer 24 covering the top surface of the tape substrate 21 at other than the regions where the semiconductor elements 23 are mounted and sealing at least the areas around the side surfaces of the semiconductor elements 23 is formed. Note that in FIG. 7 to FIG. 9, an extremely thin insulating coating 31 is illustrated together with the sealing resin layer 24 and is not illustrated separately.

Figure 8:
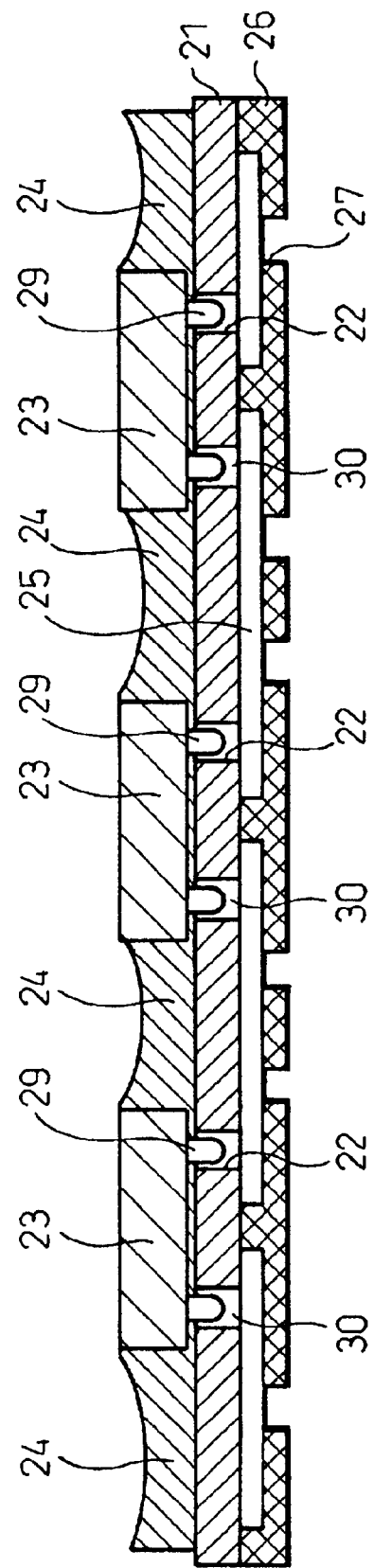
FIG. 8 is a sectional view of the state when forming a sealing resin layer covering the top surface of the tape substrate at other than the regions where the semiconductor elements are formed and sealing at least the areas surrounding the side surfaces of the semiconductor elements in a manner different from FIG. 7.

FIG. 7 shows the state where the sealing resin layer 24 covers also the semiconductor elements 23 and is formed to a substantially identical thickness overall. As another example, however, as shown in FIG. 8, the sealing resin layer 24 does not necessarily have to cover the semiconductor elements 23 at the stage of this step. The thickness of the sealing resin layer 24 may also be made the same as the height of the semiconductor elements 23 at the contact portions with the side surfaces of the semiconductor elements 23 and made thinner at the regions away from the semiconductor elements 23. That is, the thickness of the sealing resin layer 24 formed at the stage of this step may be set so that a thickness enabling the areas around the side surfaces of the semiconductor elements 23 to be completely sealed is left after the grinding and polishing performed in the next step.

Figure 9:
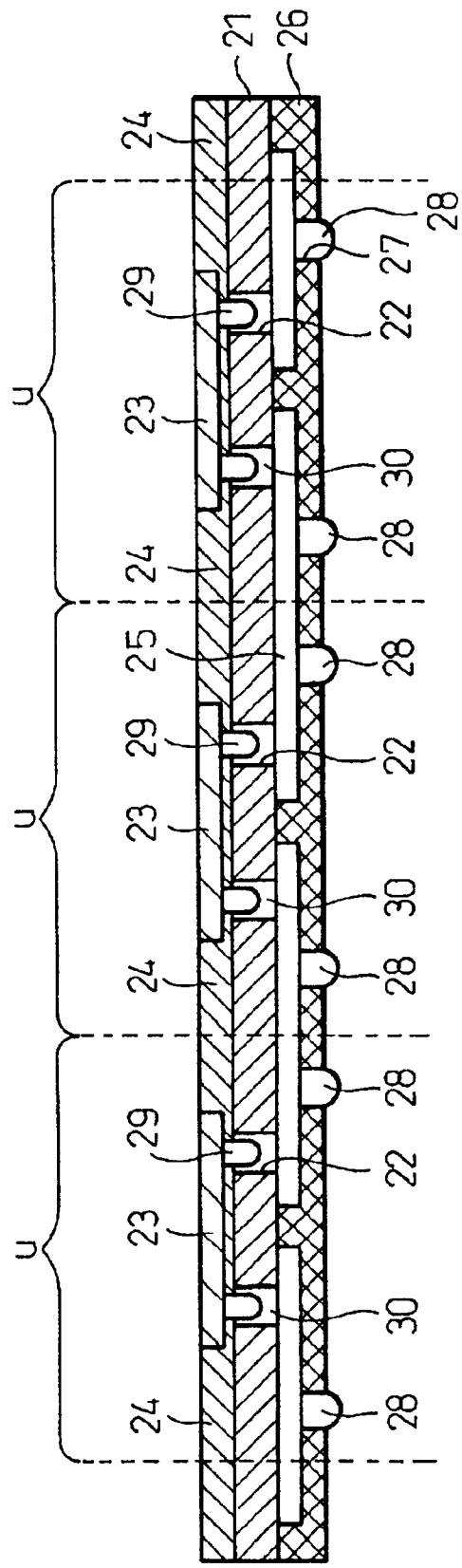
FIG. 9 is a sectional view of the state when grinding and polishing the top part of the sealing resin layer and the back surface portions of the semiconductor elements to a predetermined thickness and forming external connection terminals.

Next, as shown in FIG. 9, the top part of the sealing resin layer 24 and the back surface 23B portions of the semiconductor elements 23 are ground and polished to a predetermined thickness. Due to this, for example, it is possible to make semiconductor elements 23 of a thickness of around 500 $\mu$m in the state of FIG. 7 or FIG. 8 a thin 50 to 100 $\mu$m. As a result, the semiconductor devices 20 can be reduced to a thickness of 120 to 300 $\mu$m. This is less than ¼ of the approximately 1200 $\mu$m thickness of the thin-small outline package (TSOP) most frequently used in the past.

After the grinding and polishing, external connection terminals 28 projecting from the bottom surface of the solder resist layer 26 are formed in the through holes 27 of the solder resist layer 26. This can be done by reflowing after placing solder balls or screen printing solder paste.

Finally, the assembly is cut into semiconductor package units "u" at the positions shown by the broken lines in FIG. 9 to obtain individual semiconductor devices 20 (FIG. 3).

Second Embodiment

FIG. 10 show another example of the semiconductor device according to the first aspect of the present invention, in (1) sectional and (2) top views. Portions corresponding to the structure of the first embodiment are assigned the same reference numerals as in FIG. 3.

The illustrated semiconductor device 40 includes, in addition to the structure shown in FIG. 3, low melting point metal conductors (conductor columns) 32. The conductors 32 pass through the sealing resin layer 24 sealing the area around the side surfaces of the semiconductor element 23 and the tape substrate 21 at regions where the sealing resin layer 24 is formed, have top ends exposed at the top surface of the sealing resin layer 24, and have bottom ends electrically connected to the metal interconnection layer 25.

Figure 11:
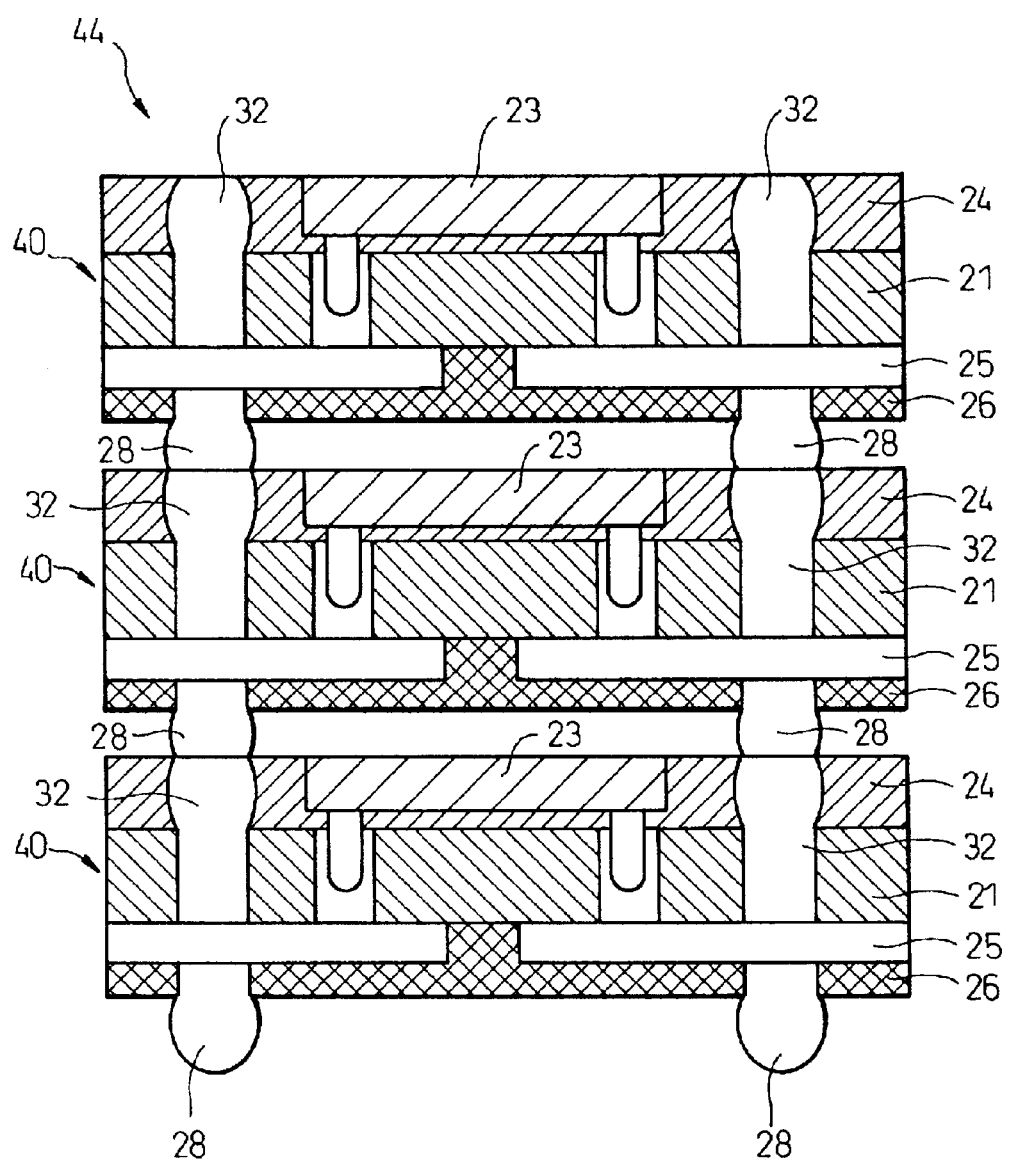
FIG. 11 is a sectional view of a thin multilayer semiconductor device formed by stacking a plurality of the semiconductor devices of FIGS. 10A and 10B.

A plurality of the semiconductor devices 40 of FIG. 10 may be stacked in layers as shown in FIG. 11 to form a thin multilayer semiconductor device 44. That is, by connecting the top ends of the low melting point metal conductors 32 of a bottom semiconductor device 40 and the bottom ends of the external connection terminals 28 of a top semiconductor device 40, a single semiconductor device 4 comprised of an integral circuit including a plurality of semiconductor elements 23 (in this example, three) in a multilayer structure is formed. The semiconductor devices 40 may be stacked as follows:

That is, a plurality of semiconductor devices are positioned and stacked by a fixture having the external shape of the semiconductor devices (external guide), then the metal is made to reflow all together in the state with a suitable load applied in the stacking direction, whereby a multilayer semiconductor device is formed. Alternatively, a plurality of semiconductor devices are stacked while positioning them by passing pins through guide holes provided in the individual semiconductor devices, then the metal is made to reflow all together in the state with a suitable load applied in the stacking direction.

An example of the process of production of a semiconductor device of the first aspect of the present invention shown in FIG. 10 will be explained next with reference to FIGS. 12 to 16. Portions corresponding to the structure of the first embodiment shown in FIG. 4 to FIG. 9 are assigned the same reference numerals as in FIG. 4 to FIG. 9.

Figure 12:
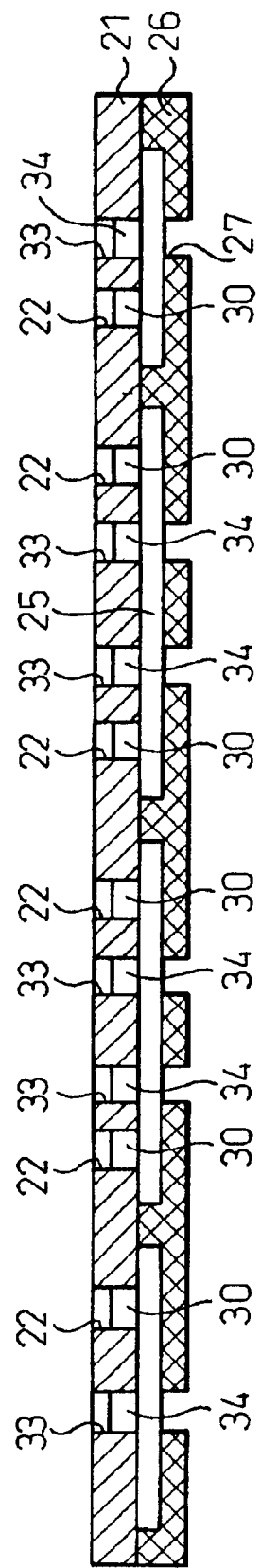
FIG. 12 is a sectional view of an initial structure first prepared for producing the semiconductor device according to the first aspect of the present invention shown in FIG. 10.

The initial structure shown in FIG. 12 is the same as the initial structure of the first embodiment shown in FIG. 4 except that through holes 33 are formed in the tape substrate 21 in addition to the through holes 22. The through holes 22 are provided at positions corresponding to the connection terminals 29 of the semiconductor elements 23 in the same way as in the first embodiment, while the through holes 33 are provided in the regions of formation of the sealing resin layer 24 sealing the areas around the side surfaces of the semiconductor elements 23. Normally, the through holes 33 are several times larger in diameter than the through holes 22. For example, when the through holes 22 have a diameter of about 25 to 100 $\mu$m, the through holes 33 have a diameter of about 500 $\mu$m. A small amount of flux 34 is placed in each through hole 33 with a bottom surface defined by the metal interconnection layer 25. The rest of the initial structure shown in FIG. 12 is formed by processing similar to the first embodiment.

Figure 13:
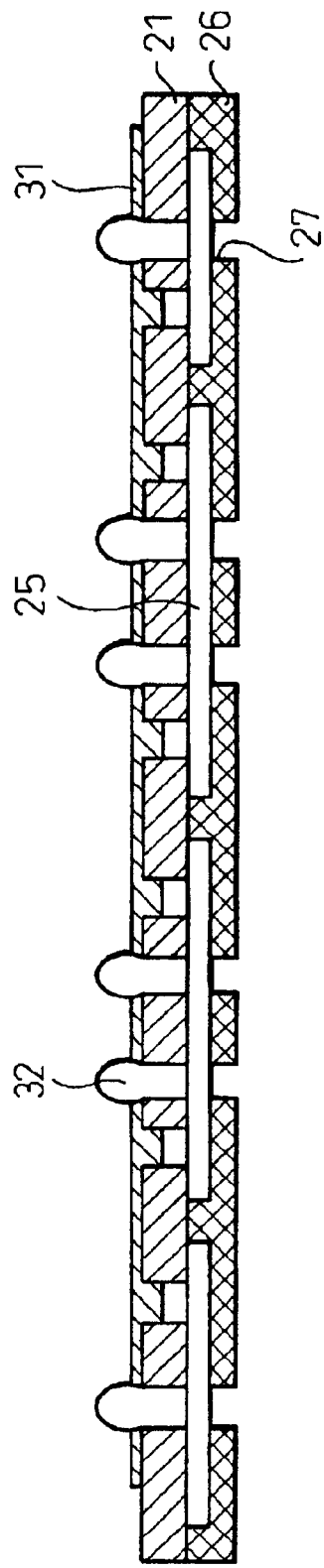
FIG. 13 is a sectional view of the state when forming a conductor of a low melting point metal and insulating coating on the initial structure shown in FIG. 12.

Next, as shown in FIG. 13, low melting point metal conductors 32 projecting from the top surface of the sealing resin layer 24 are formed in the through holes 33. This is done by placing balls of the low melting point metal, for example, solder balls, on the flux 34 in the through holes 33 and reflowing them. Next, the same procedure is followed as in the first embodiment to form the insulating coating 31.

Figure 14:
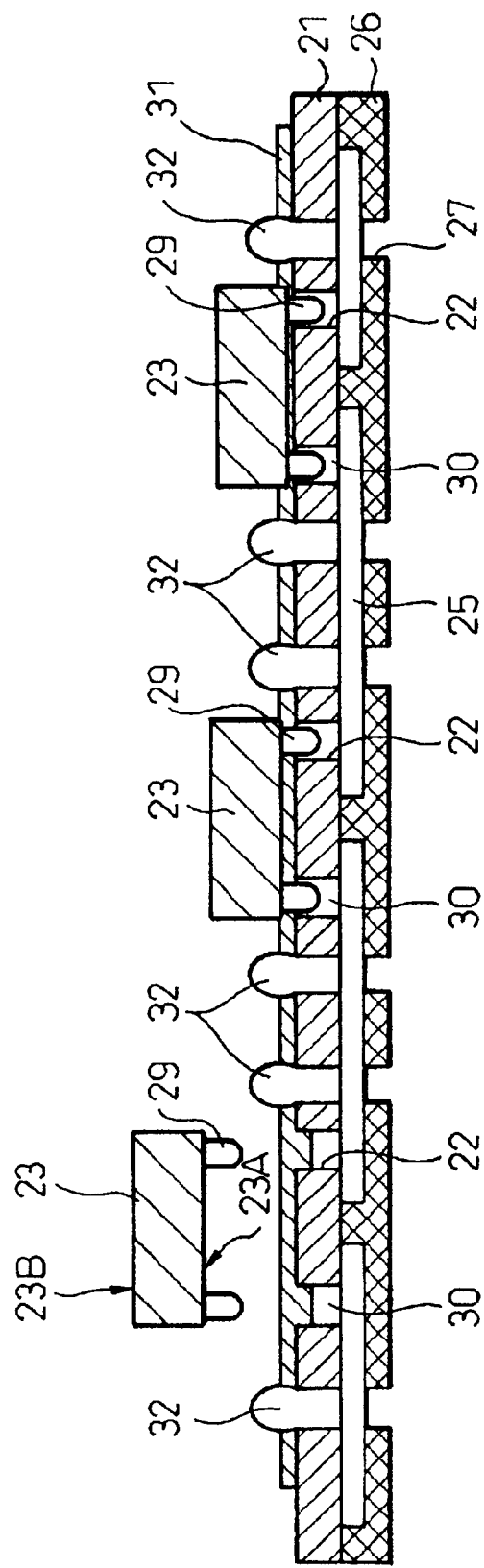
FIG. 14 is a sectional view of the step of arranging and bonding semiconductor elements on the coating before curing.

Next, as shown in FIG. 14, the same procedure is followed as in the first embodiment to arrange and bond the semiconductor elements 23 on the precured coating 31. Along with this, the connection terminals 29 projecting upward from the active surfaces 23A of the semiconductor elements 23 are inserted into the through holes 22 of the tape substrate 21 and pushed into the low melting point metal 30.

Figure 15:
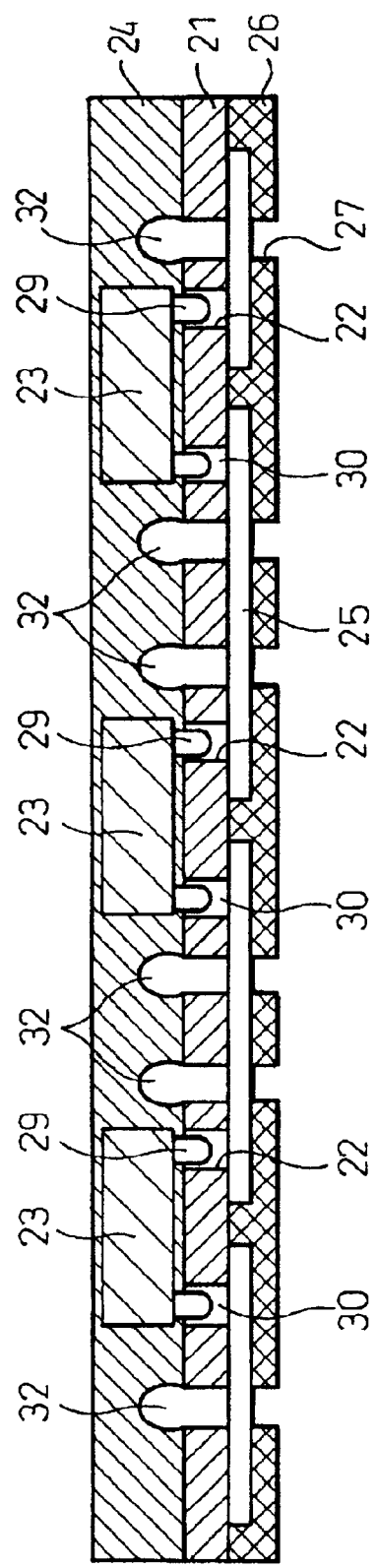
FIG. 15 is a sectional view of the state when forming a sealing resin layer covering the top surface of the tape substrate at other than the regions where the semiconductor elements are formed and sealing at least the areas surrounding the side surfaces of the semiconductor elements.
Figure 16:
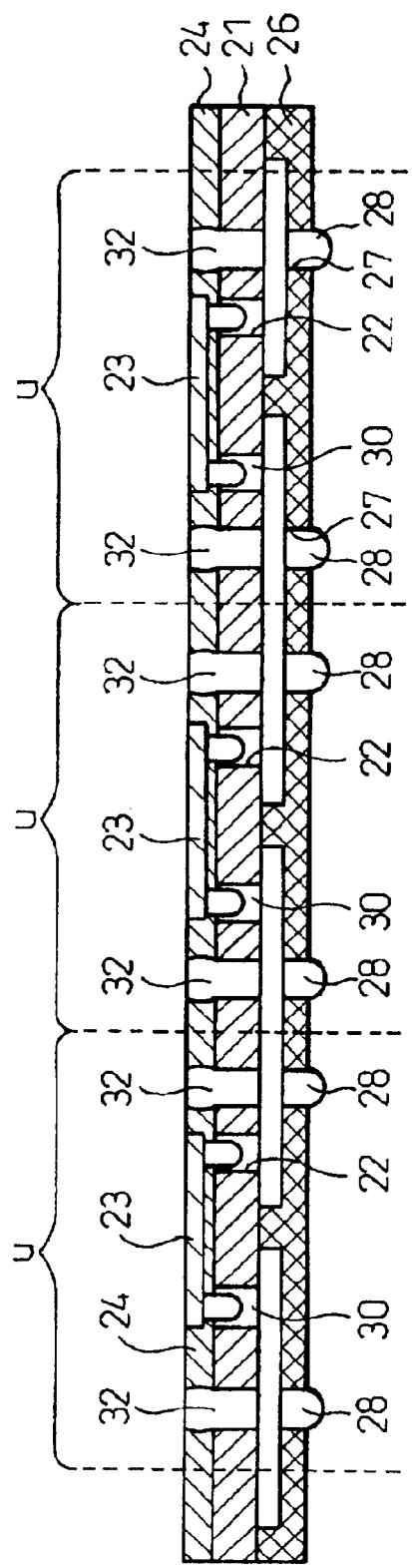
FIG. 16 is a sectional view of the state when grinding and polishing the top part of the sealing resin layer and the back surface portions of the semiconductor elements to a predetermined thickness and forming external connection terminals.

Next, as shown in FIG. 15, a sealing resin layer 24 covering the top surface of the tape substrate 21 at other than the regions where the semiconductor elements 23 are mounted and sealing at least the areas around the side surfaces of the semiconductor elements is formed. In FIG. 15 to FIG. 16, the illustration of the insulating coating 31 is omitted.

FIG. 15 shows the state where the sealing resin layer 24 covers also the semiconductor elements 23 and is formed to a substantially identical thickness overall. As shown in FIG. 8 relating to the first embodiment, however, the sealing resin layer 24 does not necessarily have to cover the semiconductor elements 23 at the stage of this step. The thickness of the sealing resin layer 24 may also be made the same as the height of the semiconductor elements 23 at the contact portions with the side surfaces of the semiconductor elements 23 and made thinner at the regions away from the semiconductor elements 23. That is, the thickness of the sealing resin layer 24 formed at the stage of this step may be set so that a thickness enabling the areas around the side surfaces of the semiconductor elements 23 to be completely sealed is left after the grinding and polishing performed in the next step.

Next, as shown in FIG. 16, the top part of the sealing resin layer 24, the top parts of the conductors 32, and the back surface 23B portions of the semiconductor elements 23 are ground and polished to a predetermined thickness.

After the grinding and polishing, external connection terminals 28 are formed in the through holes 27 of the solder resist layer 26 in the same way as in the first embodiment.

Finally, the assembly is cut into semiconductor package units "u" at the positions shown by the broken lines in FIG. 16 to obtain individual semiconductor devices 20 (FIG. 10).

Third Embodiment

FIG. 17 shows still another example of the semiconductor device according to the first aspect of the present invention, in (1) sectional and (2) top views. Portions corresponding to the structure of the first embodiment shown in FIG. 3 are assigned the same reference numerals as in FIG. 3.

The illustrated semiconductor device 60 includes, instead of the sealing resin layer 24 in the structure shown in FIG. 3, an insulating frame 36 bonded to the top surface of the tape substrate 21 other than at the region where the semiconductor element 23 is mounted and surrounding the side surfaces of the semiconductor element 23 with a gap G and a resin sealing layer 24 filling the gap G and sealing the area around the side surfaces of the semiconductor element 23 and further includes column-shaped conductors (conductor columns) of a low melting point metal passing through the frame 36 and the tape substrate 21 at a region where the frame 36 is formed, having top ends exposed at the top surface of the frame 36, and having bottom ends electrically connected to the metal interconnection layer 25.

Figure 18:
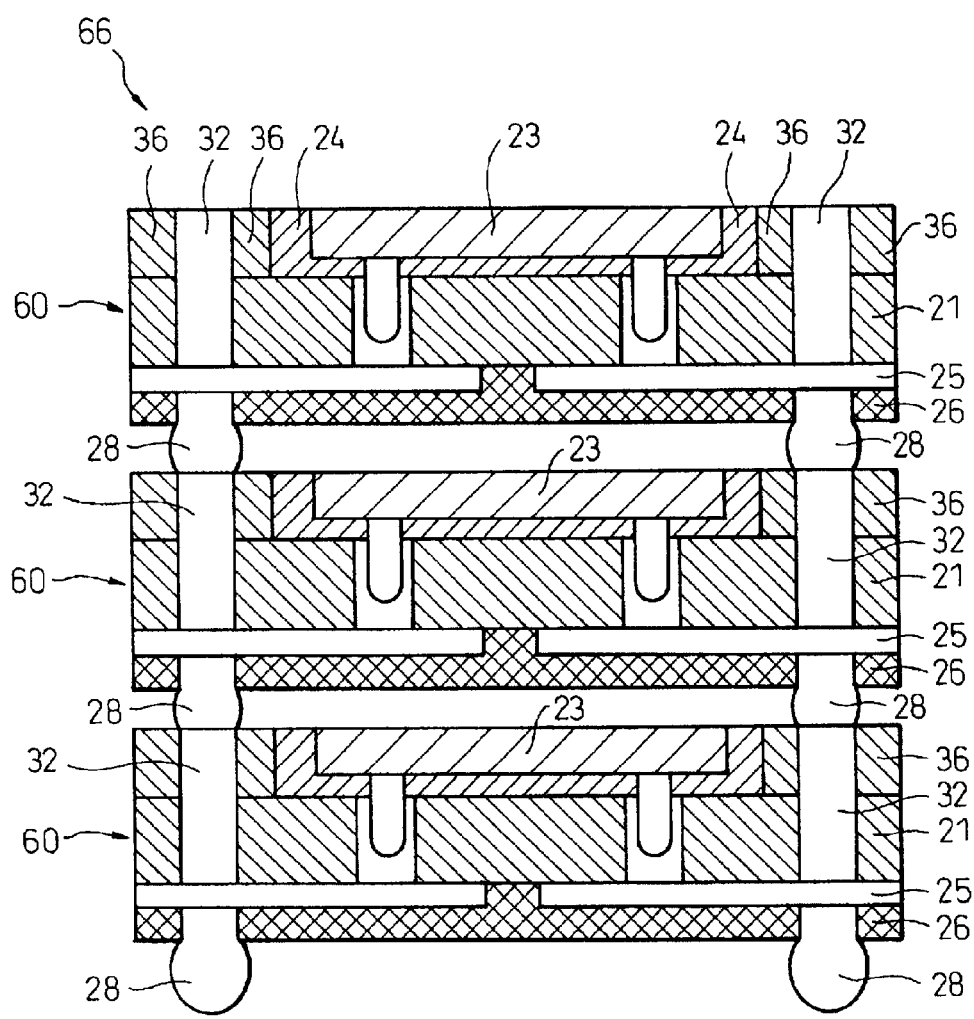
FIG. 18 is a sectional view of a thin multilayer semiconductor device formed by stacking a plurality of the semiconductor devices of FIG. 17.

A plurality of the semiconductor devices 60 of FIG. 17 may be stacked in layers as shown in FIG. 18 to form a thin multilayer semiconductor device 66. That is, by connecting the top ends of the low melting point metal column-shaped conductors 32 of a bottom semiconductor device 60 and the bottom ends of the external connection terminals 28 of a top semiconductor device 60, a single semiconductor device 66 comprised of an integral circuit including a plurality of semiconductor elements 23 (in this example, three) in a multilayer structure is formed. The semiconductor devices 60 may be stacked in the same way as shown in the second embodiment.

An example of the process of production of a semiconductor device 60 of the first aspect of the present invention shown in FIG. 17 will be explained next with reference to FIGS. 19 to 22. Portions corresponding to the structure of the first embodiment shown in FIG. 4 to FIG. 9 are assigned the same reference numerals as in FIG. 4 to FIG. 9.

Figure 19:
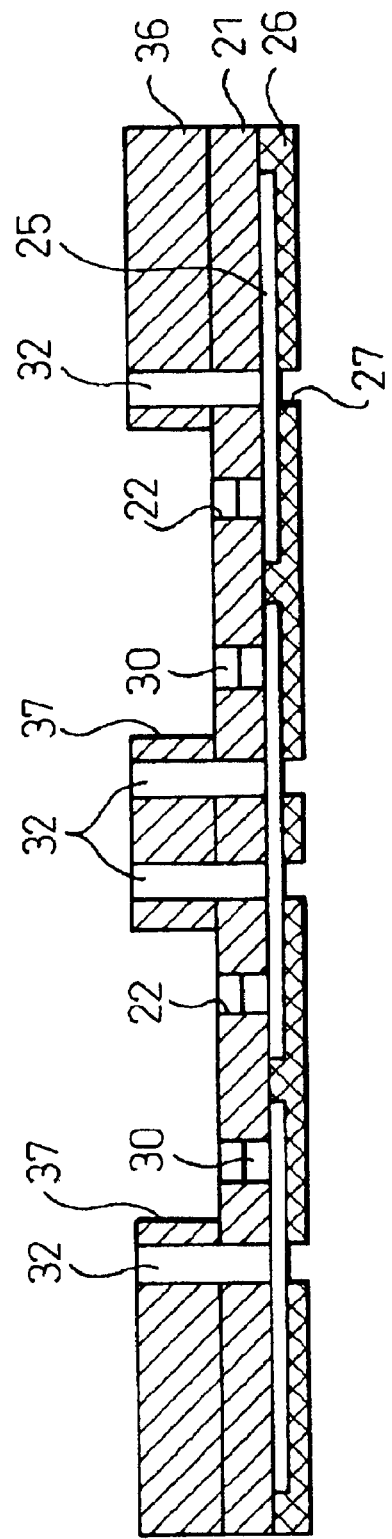
FIG. 19 is a sectional view of an initial structure first prepared for producing the semiconductor device according to the first aspect of the present invention shown in FIG. 17.

The initial structure shown in FIG. 19, in addition to the structure shown in FIG. 4, has an insulating substrate 36 having openings 37 at regions for mounting the semiconductor elements 23 bonded to the top surface of the tape substrate 21 and is formed with column-shaped conductors 32 passing through the tape substrate 21 and the insulating substrate 36. The openings 37, as shown in FIG. 17(2), have shapes and dimensions enabling semiconductor elements 23 to be accommodated with a gap G. The through holes 22 of the tape substrate 21 are provided at positions corresponding to the connection terminals 29 of the semiconductor elements in the same way as in the first embodiment.

The insulating substrate 36 is a tape of the same outer shape as the tape substrate 21 and is bonded to the top surface of the tape substrate 21 after forming the openings 37 by punching etc. Next, through holes passing through the insulating substrate 36 and tape substrate 21 are formed by laser processing at positions forming the column-shaped conductors 32. Next, the column-shaped conductors 32 are formed by plating to bury the holes using the copper foil before patterning to the metal interconnection layer 25 as the layer to supply the power. The rest of the portions of the initial structure of FIG. 19 are formed by processing similar to the first embodiment. Normally, the column-shaped conductors 32 are several times larger in diameter than the through holes 22. For example, when the through holes 22 have a diameter of about 25 to 100 $\mu$m, the column-shaped conductors 32 have a diameter of about 500 $\mu$m.

Figure 20:
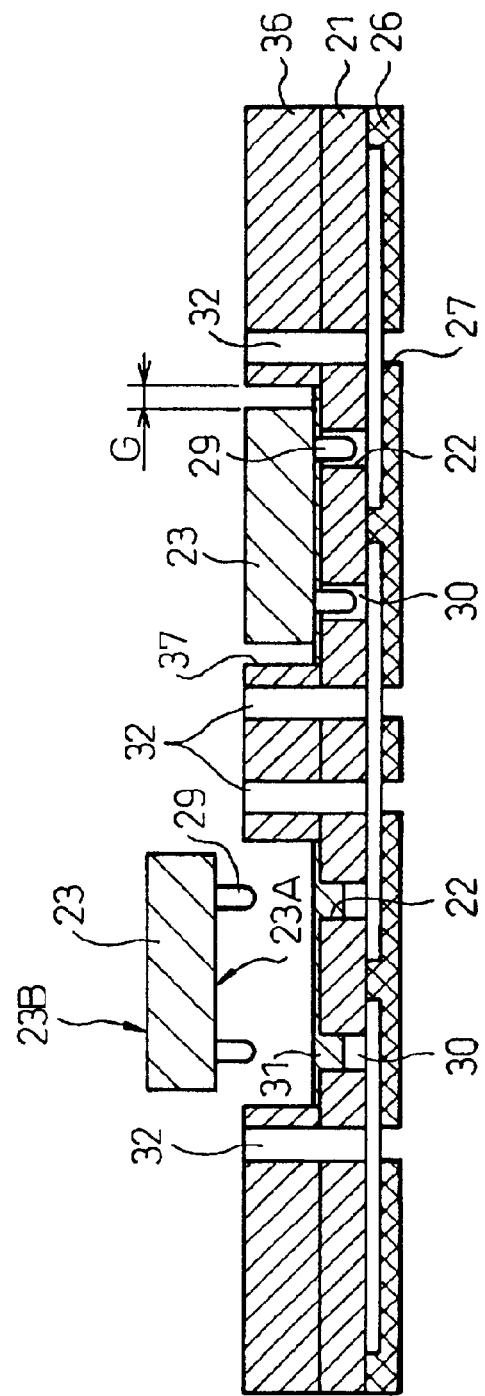
FIG. 20 is a sectional view of the step of forming an insulating coating on the initial structure shown in FIG. 19 and arranging and bonding the semiconductor elements on the coating before curing.

Next, as shown in FIG. 20, an insulating coating 31 is formed on the top surface of the tape substrate 21 exposed inside the openings 37, then the same procedure is followed as in the first embodiment to arrange and bond the semiconductor elements 23 on the precured coating 31. Along with this, the connection terminals 29 projecting up from the active surfaces 23A of the semiconductor elements 23 are inserted into the through holes 22 of the tape substrate 21 and pushed into the low melting point metal 30.

Figure 21:
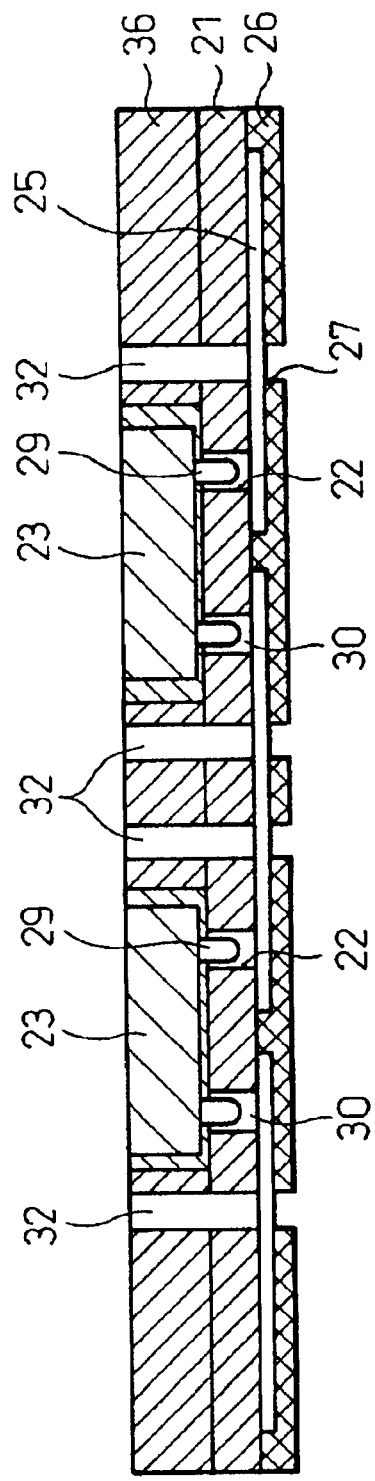
FIG. 21 is a sectional view of the state when sealing the gaps between the semiconductor elements and openings of the insulating substrate by a sealing resin layer.
Figure 22:
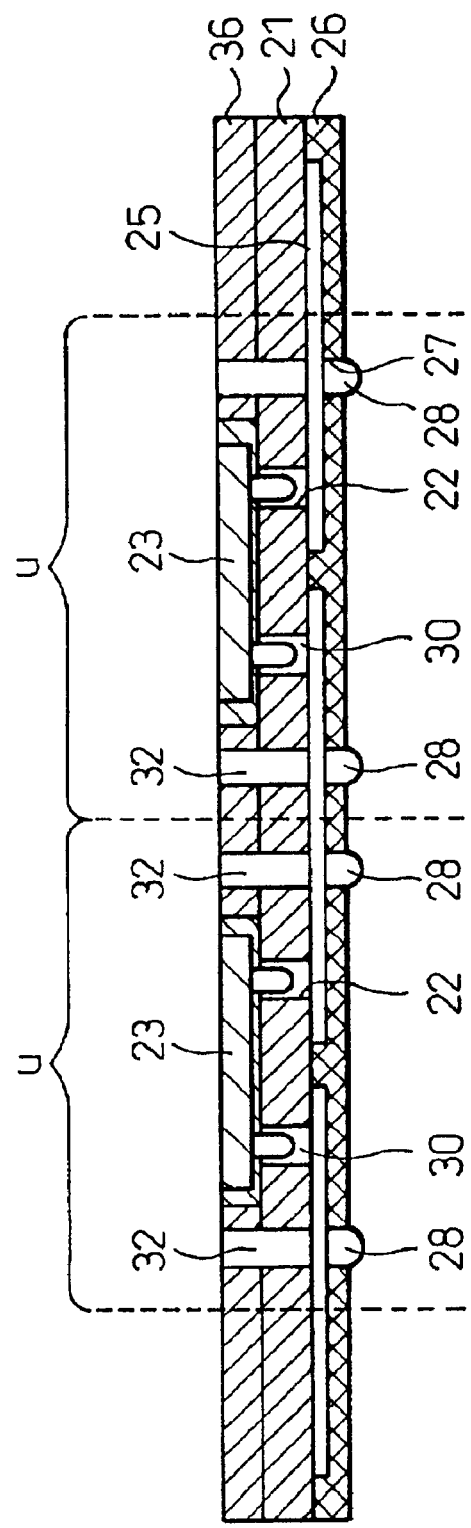
FIG. 22 is a sectional view of the state when grinding and polishing the top part of the insulating substrate, the top part of the sealing resin layer, and the back surface portions of the semiconductor elements to a predetermined thickness from the state shown in FIG. 21 and forming external connection terminals.

Next, as shown in FIG. 21, the gaps G between the semiconductor elements 23 and the openings 37 of the insulating substrate 36 are sealed by the sealing resin layer 24. Due to this, the areas around the side surfaces of the semiconductor elements 23 are sealed. In FIG. 21 to FIG. 22, the illustration of the insulating coating 31 is omitted.

Next, as shown in FIG. 22, the top part of the insulating substrate 36, the top part of the sealing resin layer 24, the top parts of the conductors 32, and the back surface 23B portions of the semiconductor elements 23 are ground and polished to a predetermined thickness.

After the grinding and polishing, external connection terminals 28 are formed in the through holes 27 of the solder resist layer 26 in the same way as in the first embodiment.

Finally, the assembly is cut into semiconductor package units "u" at the positions shown by the broken lines in FIG. 22 to obtain individual semiconductor devices 20 (FIG. 17).

Fourth Embodiment

Figure 23:
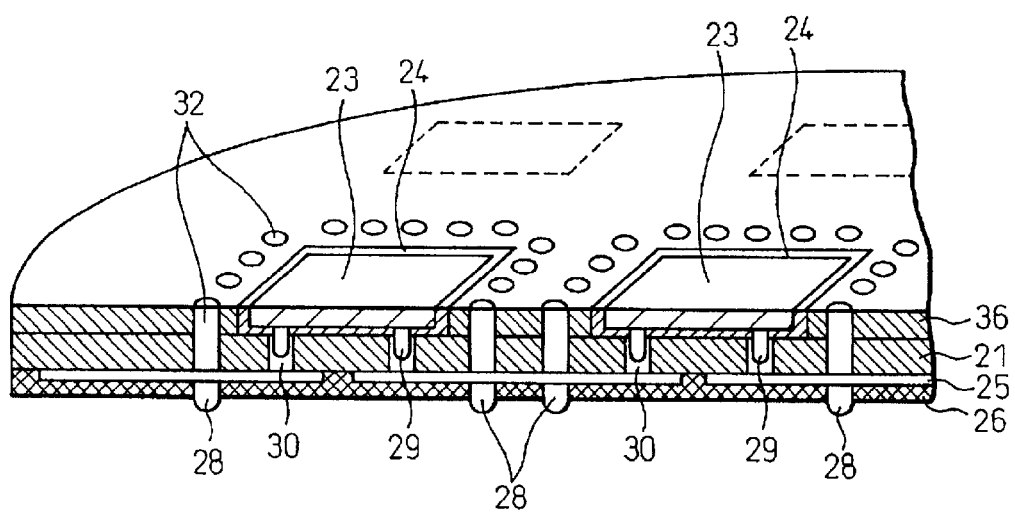
FIG. 23 is a perspective view showing, by a partial sectional view, the structure before cutting produced by using a disk shaped initial structure including the tape substrate.

FIG. 23 shows, as the initial structure including the tape substrate 21, a disk shaped structure of a diameter of 2 inches to 12 inches before cutting. By using an initial structure of such a shape and dimensions, it is possible to use an existing grinding machine, cutting machine, or other facilities for processing semiconductor wafers of the same size, therefore the cost of the new facilities can be reduced by that extent. FIG. 23 shows the case of producing semiconductor devices of the structure of the third embodiment, but the same applies to the case of the first embodiment and second embodiment.

Fifth Embodiment

FIG. 24 shows, in (1) sectional, (2) sectional and (3) top views, an example of a semiconductor device according to the second aspect of the present invention. Portions corresponding to the structures of the first to fourth embodiments are assigned reference numerals of those embodiments plus 100 (same in the following embodiments as well).

The illustrated semiconductor device 101 is comprised of an insulating substrate 121, metal interconnections 125 formed on its top surface, and a semiconductor element 123 mounted with its back surface 123B exposed upward and with its active surface 123A facing downward. The bottom ends of the connection terminals 129 projecting downward from the active surface 1223A of the semiconductor element 123 are connected to the top surfaces of the metal interconnections 125. A sealing resin layer 124 formed on the top surface of the tape substrate 121 seals the area around the side surfaces of the semiconductor element 123 and fills the gap between the active surface 123A of the semiconductor element 123 and the bottom surface of the tape substrate 121.

The conductor columns 132 extend upward from the top surfaces of the metal interconnections 125, pass through the sealing resin layer 124 at the areas around the side surfaces of the semiconductor element 123, and have top ends exposed upward. The conductor columns 132 may be substantially ball shaped as shown in FIG. 24A (more accurately, entasis shaped) or may be rod shaped as shown in FIG. 24B. The conductor columns 132 are columns or balls of a metal such as copper or nickel etc. Preferably they are balls of a low melting point metal such as solder. As the solder, use may be made of silver-tin alloy (Ag—Sn), a lead-tin alloy (Pb—Sn), a silver-tin-copper alloy (Ag—Sn—Cu), and alloys of these with bismuth (Bi) or antimony (Sb).

Figure 25:
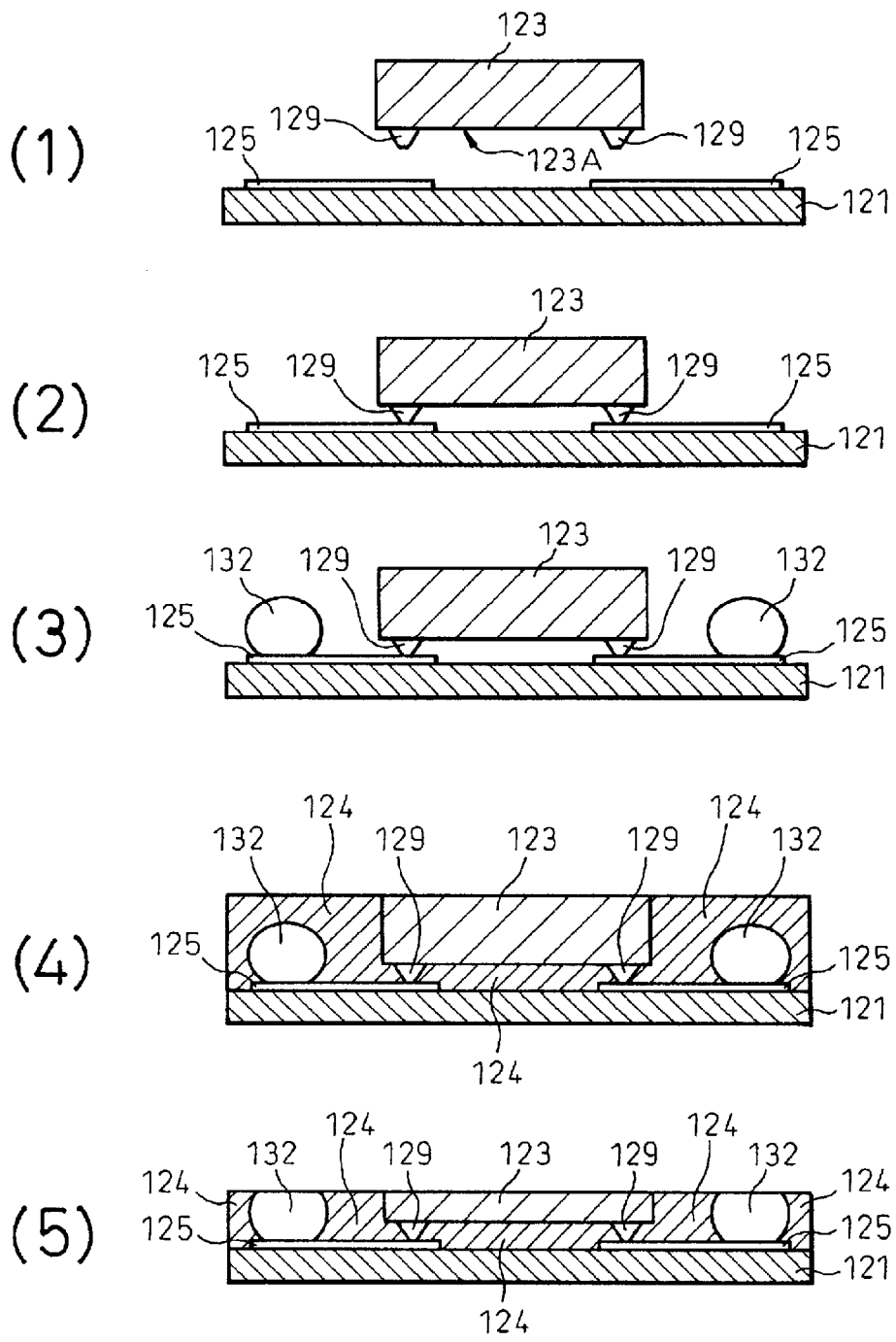
FIG. 25 shows the steps (1) to (4) for producing the semiconductor device of FIG. 24 in sectional views.

Referring to FIG. 25, a process of production of the semiconductor device 101 shown in FIG. 24 will be explained. This embodiment can be used when producing a large number of semiconductor package units all together in the same way as the first to fourth embodiments. Below, however, for simplification of the explanation, the explanation will be given of the production of a single semiconductor package unit.

First, as shown in FIG. 25(1), a semiconductor element 123 provided with connection terminals 129 on its active surface 123A and a tape substrate 121 provided with metal interconnections 125 on its top surface are prepared. The method of formation of the connection terminals 129, the materials and configuration of the tape substrate 121, and the method of formation of the metal interconnections 125 are similar to those of the first embodiment.

Next, as shown in FIG. 25(2), the connection terminals 129 of the active surface 123A of the semiconductor element 123 are bonded to the top surfaces of the metal interconnections 125 of the tape substrate 121 so as to place the semiconductor element 123 on the top surface of the tape substrate 121. This bonding (mounting) may be performed in the following way.

The connection terminals 129 are heated and press bonded to metal (solder) layers formed at predetermined positions of the metal interconnections 125 by plating etc. in advance or connection terminals 129 comprised of gold bumps are placed on the gold plating on the metal interconnections 125 and directly bonded or bonded through an anisotropic conductive film or paste by application of ultrasonic waves.

Next, as shown in FIG. 25(3), conductor columns 132 with bottom ends bonded to the top surfaces of the metal interconnections 125 are formed. In the illustrated example, the conductor columns 132 are substantially ball shaped as shown in FIG. 24(2) (more accurately entasis shaped) and consist of solder balls. Conductor columns 132 using solder balls may be formed by placing solder balls at predetermined locations on the top surface of the metal interconnections 125 or screen printing solder paste, then reflowing the metal.

The conductor columns 132 may also be rod shaped as shown in FIG. 24(2). The rod shaped conductor columns 132 may be formed in the following way.

Rod shaped members of metal, preferably copper, plated on their surfaces with solder, tin (Sn), indium (In), etc. are bonded by heating and pressure at predetermined locations of the top surfaces of the metal interconnections 125 or predetermined locations of the top surfaces of the metal interconnections 125 are plated by solder etc., then rod-shaped members are mounted and the solder made to reflow.

Next, as shown in FIG. 25(4), the sealing resin layer 124 is formed. The sealing resin layer 124 seals the area around the side surfaces of the semiconductor element 123 including the metal interconnections 125 and the conductor columns 132 and fills the gap between the active surface 123A of the semiconductor element 123 and the top surface of the tape substrate 121. The sealing resin layer 124 may be formed by molding or dotting.

Next, as shown in FIG. 25(5), the top part of the sealing resin layer 24 and the back surface portion of the semiconductor element 123 are ground and polished to a predetermined thickness. In the step of FIG. 25(4), the top surface of the sealing resin layer 124 is in the same plane as the top surface (back surface) of the semiconductor element 123, but this is not necessarily required. It is sufficient to set the thickness of the sealing resin layer 124 so that the top ends of the conductor columns 132 are exposed upward when the entire assembly, including the semiconductor element 123, is reduced to the predetermined thickness by the grinding and polishing of FIG. 25(5).

FIG. 25 shows only one semiconductor package unit, but it is also possible to produce a large number of semiconductor package units all together by the steps (1) to (5) of FIG. 25 using a tape substrate 121 of an area able to accommodate a plurality of semiconductor package units. In this case, it is possible to finally cut the tape substrate 121 into semiconductor package units to obtain individual semiconductor devices 101 (FIG. 24).

Sixth Embodiment

FIG. 26 shows, in (1) sectional and (2) top views, another example of a semiconductor device according to the second aspect of the present invention.

In the semiconductor device 102 of the present embodiment, instead of the conductor conductors 132 of the fifth embodiment, the external connection terminals 128 extend downward from the bottom surfaces of the metal interconnections 125, pass through the tape substrate 121, and project downward. The rest of the structure is the same as in the fifth embodiment. The material of the external connection terminals 128 can be selected from the same materials as used for the conductor columns 132.

Figure 27:
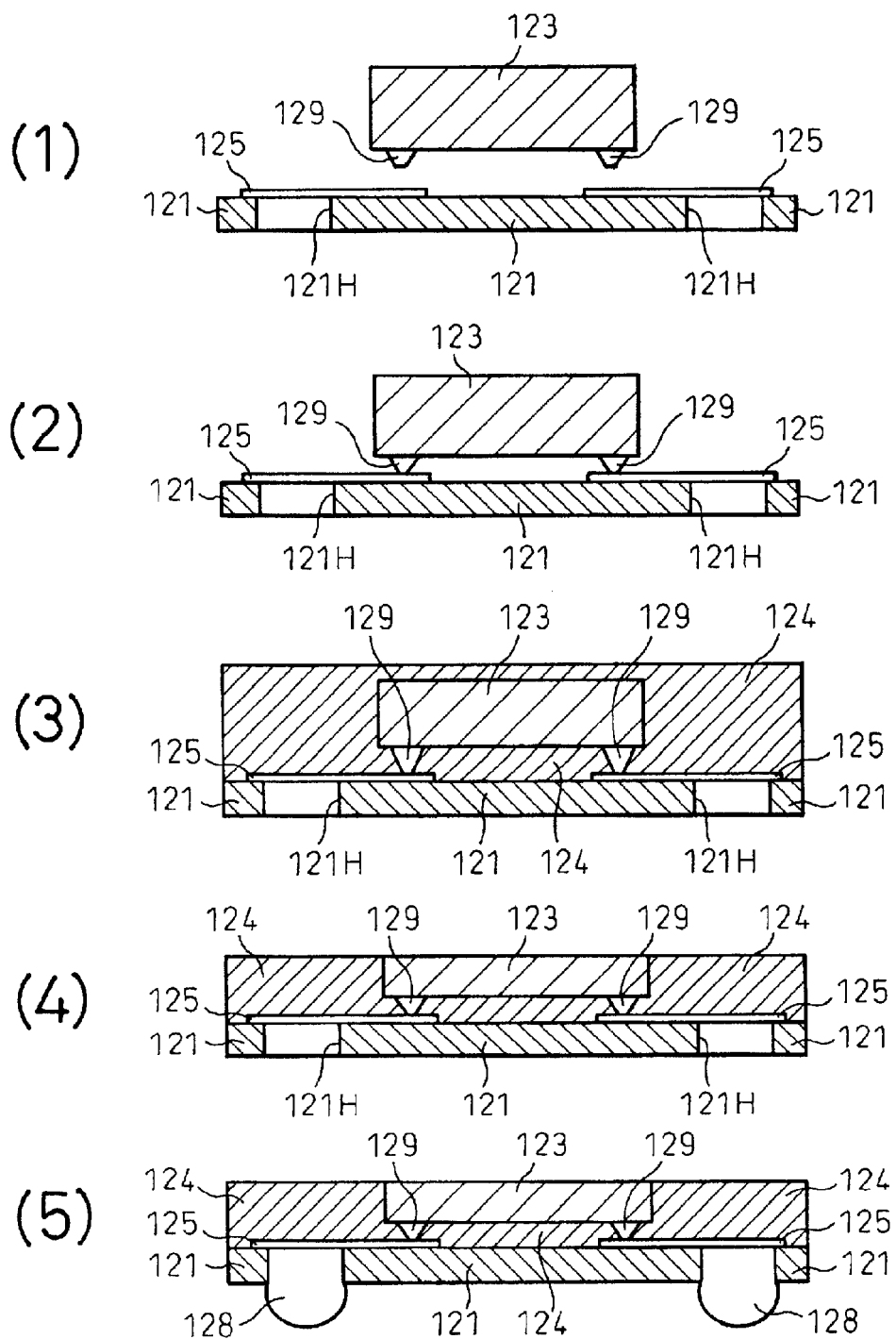
FIG. 27 shows the steps (1) to (5) for producing the semiconductor device of FIG. 26, in sectional views.

Referring to FIG. 27, a process of production of the semiconductor device 102 shown in FIG. 26 will be explained next. The present embodiment may be applied to the case of producing a large number of semiconductor package units all together in the same way as in the first to fourth embodiments, but for simplification of the explanation, the explanation will be given below of production of a single semiconductor package unit.

First, as shown in FIG. 27(1), a semiconductor element 123 provided with connection terminals 129 on its active surface 123A and a tape substrate 121 are prepared. The tape substrate 121 is provided with metal interconnections 125 on its top surface, has through holes 121H in the thickness direction at positions corresponding to the external connection terminals 128, and has bottom surfaces of the metal interconnections 125 blocking the top ends of the through holes 121H and demarcating them. The method of formation of the connection terminals 129, the materials and configuration of the tape substrate 121, and the method of formation of the metal interconnections 125 are similar to those of the first embodiment. The method of formation of the through holes 121H is similar to that of the through holes 22 of the first embodiment.

Next, as shown in FIG. 27(2), a semiconductor element is mounted on the top surface of the tape substrate 121 in the same way as the step of FIG. 25(2) of the fifth embodiment.

Next, as shown in FIG. 27(3), a sealing resin layer 124 is formed in the same way as the step of FIG. 25(4) of the fifth embodiment.

Next, as shown in FIG. 27(4), the top part of the sealing resin layer 124 and the back surface portion of the semiconductor element 123 are ground and polished to a predetermined thickness. In the step of FIG. 27(4), the top surface of the sealing resin layer 124 is higher than the top surface (back surface) of the semiconductor element 123 and the entire semiconductor element 123 is embedded inside the sealing resin layer 124, but this is not necessarily required. It is sufficient to set the thickness of the sealing resin layer 124 so as to enable the entire assembly, including the semiconductor element 123, to be made a predetermined thickness by the later grinding and polishing.

Next, as shown in FIG. 27(5), the external connection terminals 128 are formed. The external connection terminals 128 extend downward from the bottom surfaces of the metal interconnections 125 defining the top ends of the through holes 121H, fill the through holes 121H, and project downward.

The step of grinding and polishing of FIG. 27(4) and the step of forming the external connection terminals of FIG. 27(5) may be performed in that order or in a reverse order.

FIG. 27 shows only one semiconductor package unit, but it is also possible to produce a large number of semiconductor package units all together by the steps (1) to (5) of FIG. 27 using a tape substrate 121 of an area able to accommodate a plurality of semiconductor package units. In this case, it is possible to finally cut the tape substrate 121 into semiconductor package units to obtain individual semiconductor devices 102 (FIG. 26).

Seventh Embodiment

FIG. 28 shows, in (1) sectional and (2) top views, another example of the semiconductor device according to the second aspect of the invention.

In the semiconductor device 103 of the present embodiment, both the conductor columns 132 of the fifth embodiment and the external connection terminals 128 of the sixth embodiment are provided.

The process of production of the semiconductor device 103 of the present embodiment is a combination of the process of production of the fifth embodiment and the process of production of the sixth embodiment.

Referring to FIG. 25 and FIG. 27, an explanation will be given of the process of production of the semiconductor device 103 shown in FIG. 28. The semiconductor device 103 shown in FIG. 28 may also be stacked in a plurality of layers.

First, in the same way as the sixth embodiment, a semiconductor element 123 shown in FIG. 27(1) and a tape substrate 121 are prepared. The semiconductor element is mounted on the top surface of the tape substrate 121 as shown in FIG. 27(2).

Next, as shown in FIG. 27(3), conductor columns 132 with bottom ends bonded to the top surfaces of the metal interconnections 125 are formed. As shown in FIG. 25(4), a sealing resin layer 124 is then formed.

Next, the grinding and polishing step of FIG. 27(4) and the step of forming external connection terminals of FIG. 27(5) are performed in that order or in reverse order to obtain the semiconductor device 103 of FIG. 28.

Here, the explanation was given of a single semiconductor package unit, but it is also possible to produce a large number of semiconductor package units all together by the above steps using a tape substrate 121 of an area able to accommodate a plurality of semiconductor package units. In this case, it is possible to finally cut the tape substrate 121 into semiconductor package units to obtain individual semiconductor devices 103 (FIG. 28).

The semiconductor devices according to the first and second aspects of the present invention explained above include tape substrates. Below, an explanation will be given of embodiments of a semiconductor device according to a seventh aspect of the present invention not including a tape substrate.

Eighth Embodiment

Figure 30:
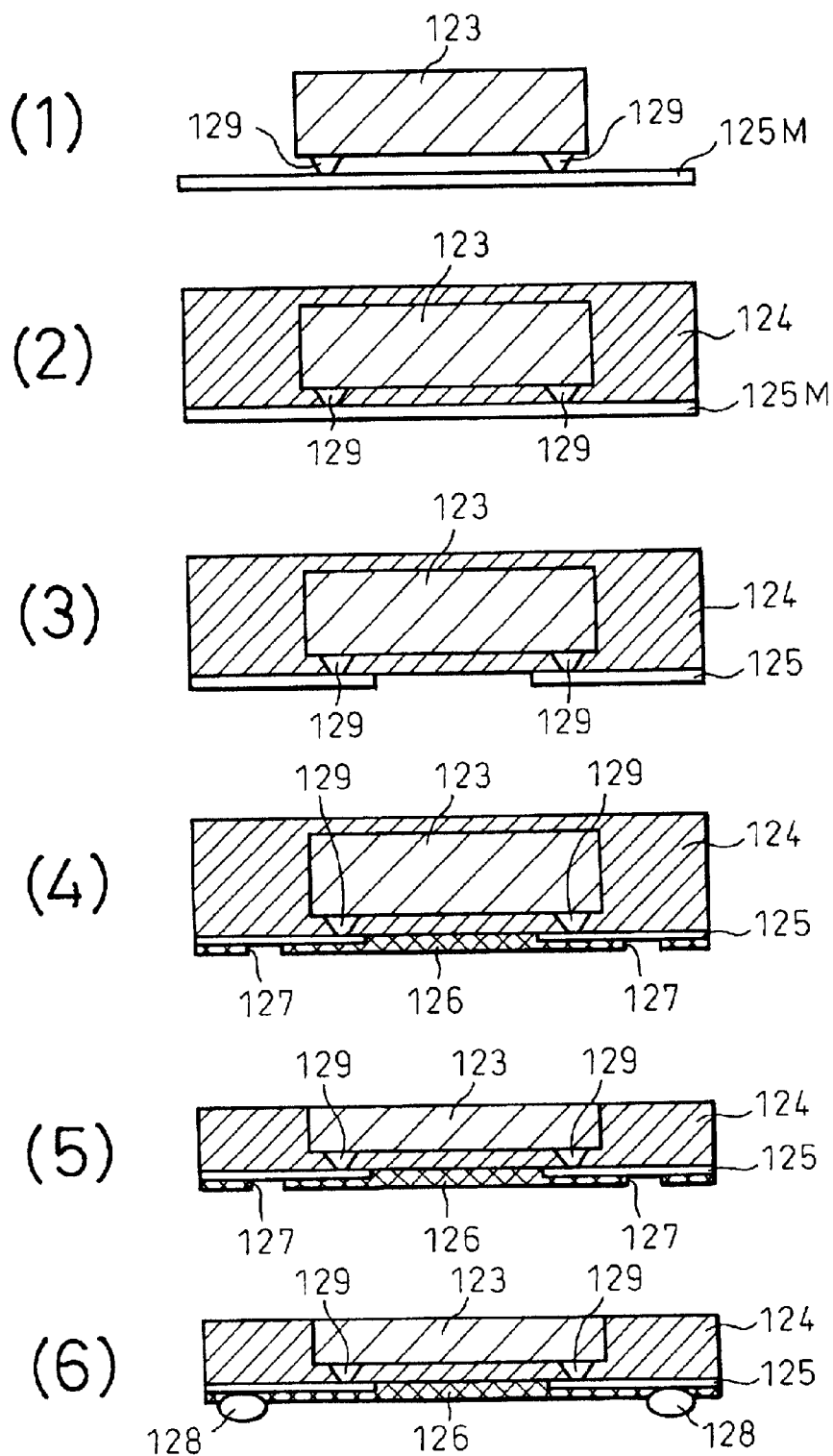
FIG. 30 shows the steps (1) to (6) for producing the semiconductor device of FIG. 29, in sectional views.

FIG. 29 shows, in sectional views, an example of a semiconductor device according to the seventh aspect of the present invention. The semiconductor device 104 shown in FIG. 29(1) is comprised of a resin member 124 of a predetermined thickness in which a semiconductor element 123 is sealed. The semiconductor element 123 has a back surface 123B exposed at the top surface of the resin member 124 and has an active surface 123A facing downward. Metal interconnections 125 are formed at the bottom surface of the resin member 124. Connection terminals 129 extending downward from the active surface 123A of the semiconductor element 123 are connected to the top surfaces of the metal interconnections 125. The top surface of the resin member 129 and the back surface 123B of the semiconductor element 123 form the same plane. The connection terminals 129 are formed as gold stud bumps, plated bumps, etc. The semiconductor device 104' shown in FIG. 29(2) is structured the same as the semiconductor device 104 of FIG. 29(1) except that the bottom surface of the resin member, including the metal interconnections 125, is covered by a solder resist layer 126 and that connection bumps 128 formed on the bottom surfaces of the metal interconnections 125 pass through the solder resist layer 126 and project downward. Referring to FIG. 30, an explanation will be given of the process of production of the semiconductor devices 104 and 104' shown in FIG. 29. The present embodiment can be applied to the case of producing a large number of semiconductor package units all together in the same way as in the first to fourth embodiments, but for simplification of the explanation, an explanation will be made of a single semiconductor package unit. First, as shown in FIG. 30(1), the semiconductor element 123 is mounted on a metal substrate 125M by bonding the front ends of the connection terminals 129 formed on the active surface 123A of the semiconductor element 123 on the top surface of a metal substrate 125 such as an aluminum foil, copper foil, copper foil formed with interconnections by metal plating, and aluminum foil clad with copper by a method such as ultrasonic bonding, alloy bonding through a low melting point metal such as indium, etc.

Next, as shown in FIG. 30(2), a resin member 124 is formed by covering the entire top surface of the metal substrate 125M with a resin. The resin member 124 seals the semiconductor element 123 inside it and has a bottom surface bonded to the metal substrate 125M.

As the resin member 124, use may be made of an epoxy resin, polyimide resin, cyanoester resin, or polycyclic aromatic resin. In particular, an epoxy resin is desirable.

To adjust the thermal expansion coefficient and heat conductivity of the resin member 124, silica, alumina, aluminum nitride, and other ceramic particles may be dispersed as an inorganic filler. The amount of dispersion is set in accordance with the desired values of the thermal expansion coefficient and heat conductivity. The particle size is 2 to 10 µm. The particles are preferably shaped as close to spheres as possible.

Next, as shown in FIG. 30(3), the metal substrate 125M is patterned to form metal interconnections 125 on the bottom surface of the resin member 124. The metal interconnections 125 have top surfaces connected to the connection terminals 129.

Next, top part of the resin member 124 and the back surface portion of the semiconductor element 123 are ground and polished to a predetermined thickness.

The above steps complete the semiconductor element 104 shown in FIG. 29(1).

Further, after the step of FIG. 30(3), as shown in FIG. 30(4), a solder resist layer 126 covering the entire bottom surface of the resin member 124 including the metal interconnections 125 is formed, then through holes 127 are formed in the solder resist layer 126. The through holes 127 are open at the bottom ends. The top ends are blocked and demarcated by the bottom surfaces of the metal interconnections 125.

Next, as shown in FIG. 30(5), the top part of the resin member 124 and the back surface portion of the semiconductor element 123 are ground and polished to a predetermined thickness.

Next, as shown in FIG. 30(6), external connection terminals 128 filling the through holes 127 and projecting downward are formed. This may be done, in the same way as the conductor columns 132 shown in FIG. 25(3), by placing solder balls or printing solder paste and then reflowing them.

Note that this completes the semiconductor device 104' shown in FIG. 29(2).

Here, the explanation was given of a single semiconductor package unit, but it is also possible to produce a large number of semiconductor package units all together by the above steps using a metal substrate 125M of an area able to accommodate a plurality of semiconductor package units. In this case, it is possible to finally cut the metal substrate 125M into semiconductor package units to obtain individual semiconductor devices 104 or 104' (FIG. 29).

Next, an explanation will be made of another process for production of the semiconductor devices 104 and 104' shown in FIGS. 29(1) and 29(2) referring to FIG. 31.

Figure 31:
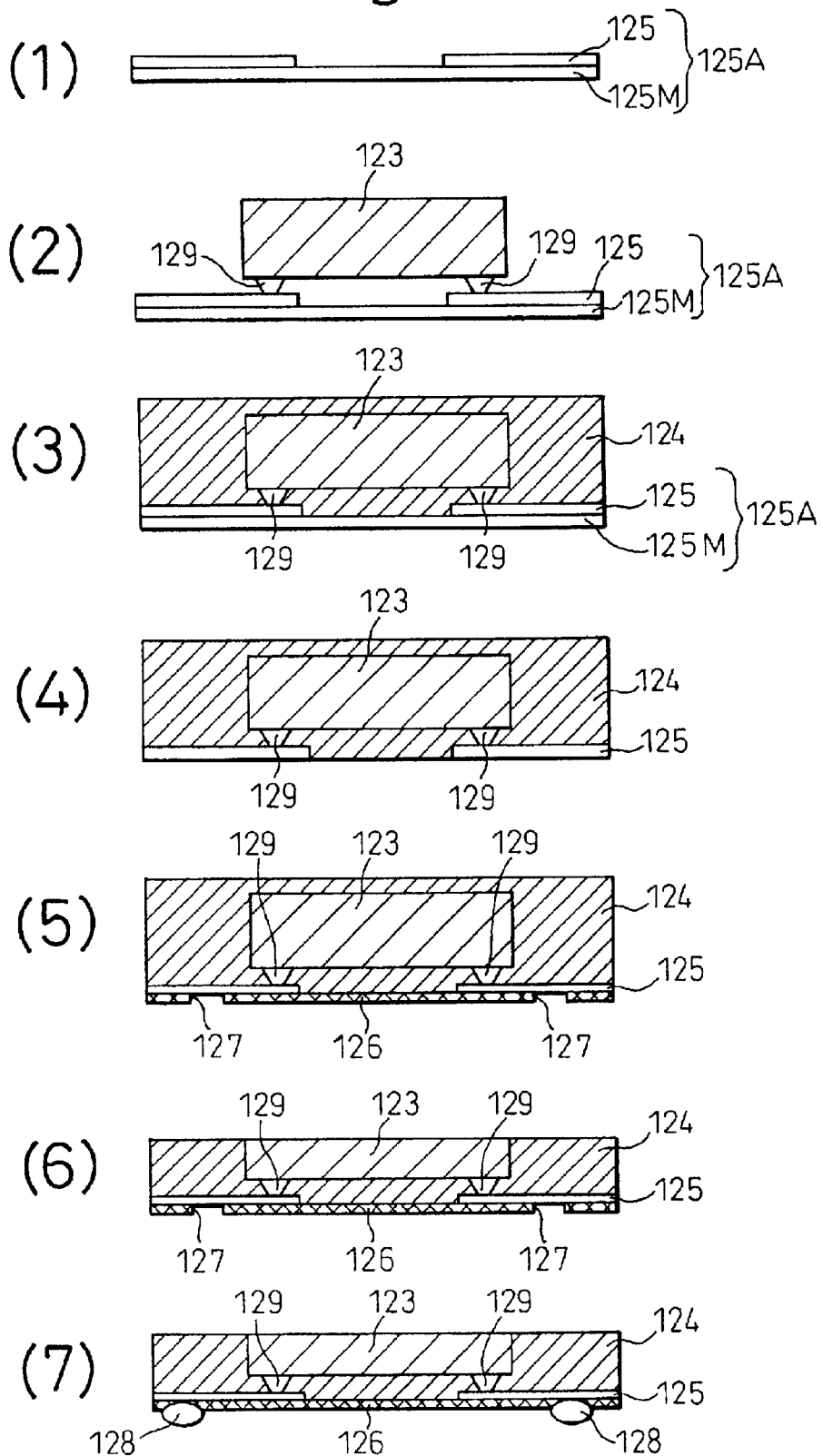
FIG. 31 shows another example of the steps (1) to (7) for producing the semiconductor device of FIG. 29, in sectional views.

First, as shown in FIG. 31(1), a composite metal plate comprised of the metal substrate 125M and an interconnection pattern of a different type of metal formed on its top surface is prepared. This is done by providing an aluminum interconnection pattern 125 on a copper substrate 125M comprised of a copper foil by aluminum plating or by providing a copper interconnection pattern 125 on an aluminum substrate 125M by etching and patterning the copper of a copper clad aluminum foil.

Next, as shown in FIG. 31(2), the semiconductor element 123 is mounted on the composite metal plate 125A by bonding the front ends of the connection terminals 129 formed on the active surface 123A of the semiconductor element 123 on the top surface of the interconnection pattern 125 by a method such as ultrasonic bonding or alloy bonding through a low melting point metal such as indium.

Next, as shown in FIG. 31(3), the resin member 124 is formed by covering the entire top surface of the composite metal plate 125A including the interconnection pattern 125 by a resin. The resin member 124 seals inside it the semiconductor element 123 and has a bottom surface bonded to the interconnection pattern 125 and the metal substrate 125M.

The resin member 124 is made of the same material as explained with reference to FIG. 30(2).

Next, as shown in FIG. 31(4), the metal substrate 125M is removed by etching. Specifically, in the case of a combination of an aluminum interconnection pattern 125 and a copper foil substrate 125M, the copper foil substrate 125M is removed by etching using an etchant which dissolves copper, but does not dissolve aluminum. Alternatively, in the case of a combination of a copper interconnection pattern 125 and aluminum substrate 125M, the aluminum substrate 125M is removed by etching using an etchant which dissolves aluminum, but does not dissolve copper. Due to this, a structure is obtained where metal interconnections 125 comprised of aluminum or copper are bonded to the bottom surface of the resin member 124.

Next, the top part of the resin member 124 and the back surface portion of the semiconductor element 123 are ground and polished to a predetermined thickness.

The above steps complete the semiconductor device 104 shown in FIG. 29(1). The position of the bonding surface of the resin member 124 and the solder resist layer 126 is in the same plane as the top surfaces of the metal interconnections 125 in the structure of FIG. 29(1), while is in the same plane as the bottom surfaces of the metal interconnections 125 in the structure obtained in the above steps.

Further, after the step of FIG. 31(4), in the order shown in FIGS. 31(5), 31(6), and 31(7), the formation of the solder resist layer 126, the grinding and polishing, and the formation of the external connection terminals 128 are performed by the same procedure as in steps shown in FIGS. 30(4), 30(5), and 30(6).

This completes the semiconductor device 104' shown in FIG. 29(2). The position of the bonding surface of the resin member 124 and the solder resist layer 126 is in the same plane as the top surfaces of the metal interconnections 125 in the structure of FIG. 29(2), while is in the same plane as the bottom surfaces of the metal interconnections 125 in the structure obtained in the above steps.

Ninth Embodiment

FIG. 32 shows, in sectional views, another example of a semiconductor device according to the seventh aspect of the present invention. The semiconductor devices 105, 105', and 105" shown in FIGS. 32(1), 32(2), and 32(3) are each further provided with a plurality of conductor columns 132 in addition to the structure of the semiconductor device 104 shown in FIG. 29A. The conductor columns 132 pass through the resin member 124 from the top surface of the metal interconnections 125 and extend upward. The top ends are exposed at the top surface of the resin member 124.

Here, in the semiconductor device 105 of FIG. 32(1), only the top ends of the conductor columns 124 are exposed from the resin member 124. In the semiconductor device 105' of FIG. 32(2), the top ends and the side surfaces of the conductor columns 132 are exposed from the resin member 124.

The semiconductor device 105" of FIG. 32(3) is provided with conductor columns 132A with only top ends exposed from the resin member 124 and conductor columns 132B with top ends and side surfaces exposed from the resin member 124. A solder resist layer 126 covering the bottom surface of the resin member 124, including the metal interconnections, is formed. The solder resist layer 126 does not cover the portions of the metal interconnections 125 connected with the conductor columns 132B with the side surfaces exposed. The bottom surfaces of the metal interconnections are exposed at these portions.

The conductor columns 132, 132A, and 132B may be formed by copper (Cu), nickel (Ni), Kovar (tradename), and other metals or alloys or tin-silver (Sn—Ag) alloy, tin-lead (Sn—Pb) alloy, or other low melting point alloys.

To produce the semiconductor devices 105, 105', and 105", shown in FIGS. 32(1) to 32(3), it is sufficient to form conductor columns 132 by forming stud bumps, bonding metal columns, etc. in advance on the top surface of the metal substrate 125 used in the process of production explained by FIG. 30 or FIG. 31 in the eighth embodiment and perform the steps (1) to (6) of FIG. 30 or FIG. 31 in the same way as the eighth embodiment.

10th Embodiment

Figure 33:
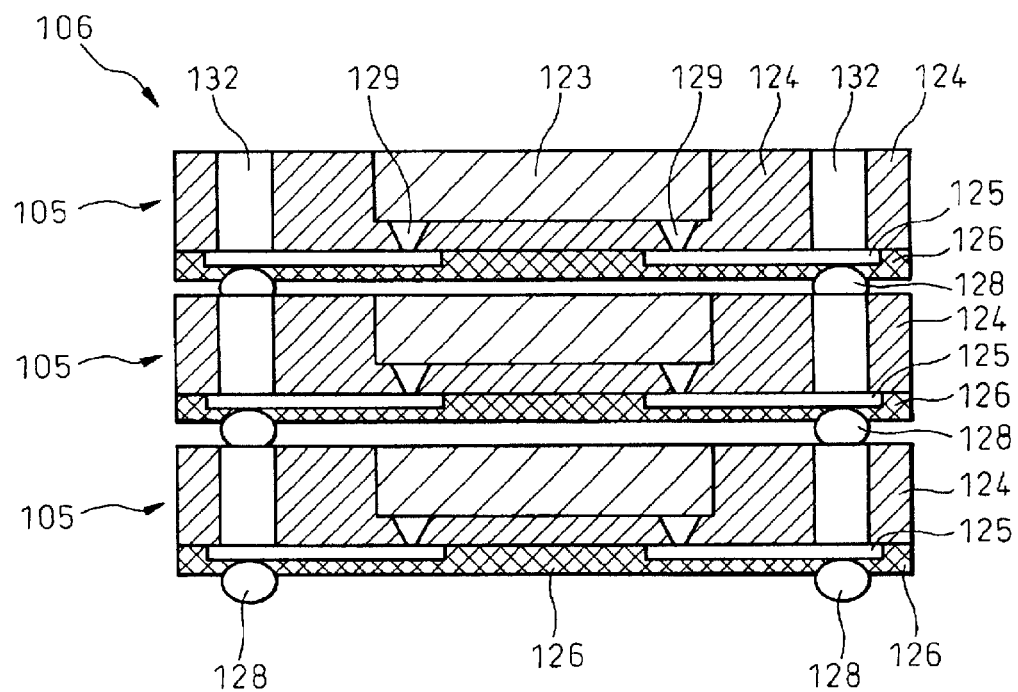
FIG. 33 is a sectional view of a thin multilayer semiconductor device formed by stacking a plurality of the semiconductor devices of FIG. 32.

FIG. 33 shows an example of a multilayer semiconductor device comprised of a plurality of semiconductor devices 105 shown in FIG. 32(1) stacked in layers.

The illustrated semiconductor device 106 comprises three semiconductor devices 105 stacked in layers. In addition to the structure of FIG. 32(1), a solder resist layer 126 and connection bumps 128 are formed in the same way as in FIG. 29(2), then the devices are stacked to form an integral unit. The top ends of bottom conductor columns 132 and the bottom surfaces of top metal interconnections are electrically connected with each other through the connection bumps 128.

11th Embodiment

FIG. 34(1) shows an example of a parallel semiconductor device comprised of a plurality of semiconductor devices 105' shown in FIG. 32(2) connected to each other at their side surfaces.

The illustrated semiconductor device 107 comprises two semiconductor devices 105' connected in parallel. The bottom surface of each resin member 124, including the metal interconnections 125, are covered by a solder resist layer 126 except at the side ends. The side surfaces of the conductor columns 132 exposed at the side surfaces of the resin members 124 are electrically connected with each other through solder or another low melting point metal 138. This connection may be performed as follows. Low melting point metal balls are placed or a low melting point metal paste is printed or a low melting point metal is supplied by dotting, followed by reflowing, whereby the low metal point metal 138 spreads over the exposed surfaces of the metal interconnections 125 and the conductor columns 132 for bonding. When there is a large interval between bonded portions, the bonding may be performed by dotting of a conductor paste.

FIG. 34B shows a multilayer parallel semiconductor device comprised of a plurality of semiconductor devices 105' shown in FIG. 32(2) stacked together and connected in parallel.

The illustrated semiconductor device 108 is comprised of two stacked layers each having two semiconductor devices 105' connected in parallel. The semiconductor devices 105' consist of a combination of the multilayer semiconductor device 106 of FIG. 33 and the parallel semiconductor device 107 of FIG. 34(1).

12th Embodiment

FIG. 35(1) shows an example of a semiconductor device according to the third aspect of the present invention including a capacitor.

The illustrated semiconductor device 109 comprises, in addition to the structure of the semiconductor device 104' of FIG. 29(2), a capacitor 143 sealed in the resin member 124. The capacitor 143 has two electrode terminals 145 directly connected to the top surfaces of the metal interconnections 125. As shown in FIG. 35(2), preferably the capacitor 143 is a multilayer ceramic capacitor. The pattern surfaces of the inner electrodes 147 of the capacitor 143 are perpendicular to the thickness direction of the resin layer 124. The capacitor 143 is for example a normal ceramic multilayer capacitor. The spaces between the inner electrodes 147 are filled by a dielectric 149 such as strontium titanate. The electrostatic capacity, that is, the effective area, is determined by the thickness after grinding and polishing, so it is necessary to estimate the final thickness in the design.

As the capacitor 143, a commercially available capacitor such as a chip capacitor is suitably used.

Note that the structure including the capacitor 143 is not limited to the semiconductor device shown in FIG. 35(1) and can also be applied to the semiconductor devices shown in FIGS. 24(1) and 24(2), FIG. 29(1), and FIGS. 32(1) to 32(3).

Summarizing the effects of the present invention, there are provided semiconductor devices, that is, thin semiconductor packages, and processes of production thereof, which reduce and simultaneously achieve uniform mounting heights, do not require complicated steps for mounting individual chips, improve the manufacturing yield, achieve uniform heights of the semiconductor devices without being affected by variations in thickness of the chips, and enable electrical tests to be performed all at once.

While the invention has been described by reference to specific embodiments chosen for purposes of illustration, it should be apparent that numerous modifications could be made thereto by those skilled in the art without departing from the basic concept and scope of the invention.

What is claimed is:

1. A semiconductor device comprising:

a resin member of a predetermined thickness, said resin member being made of a seal resin;

a semiconductor element sealed inside said resin member, having a back surface exposed at a top surface of said resin member, and having an active surface facing downward;

metal interconnections formed directly on the bottom surface of the resin member, said metal interconnections having a top surface, said top surface of said metal interconnections being entirely covered by said resin member such that said metal interconnections are formed in their entirety on said bottom surface of said resin member;

connection terminals extending downward from the active surface of the semiconductor element and having bottom ends connected to top surfaces of said metal interconnections;

a solder resist layer covering the entire bottom surface of said resin member including said metal interconnections; and connection bumps formed on the bottom surfaces of said metal interconnections, passing through said solder resist layer, and projecting downward.

2. A semiconductor device as set forth in claim 1, wherein the top surface of said resin member and the back surface of said semiconductor element form substantially the same plane.

3. A semiconductor device as set forth in claim 1, wherein an inorganic filler is dispersed in said resin member.

4. A semiconductor device as set forth in claim 2, wherein the top surface of said resin member and the back surface of said semiconductor element are ground to form substantially the same plane.

* * * * *